US007932117B2

(12) United States Patent
Ueya

(10) Patent No.: US 7,932,117 B2
(45) Date of Patent: Apr. 26, 2011

(54) PRESSURE SENSOR AND MANUFACTURING METHOD THEREFOR

(75) Inventor: Yuki Ueya, Iwata (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 11/825,797

(22) Filed: Jul. 9, 2007

(65) Prior Publication Data

US 2008/0006093 A1 Jan. 10, 2008

(30) Foreign Application Priority Data

Jul. 10, 2006 (JP) ................................ 2006-189021
Jul. 19, 2006 (JP) ................................ 2006-196578
Aug. 3, 2006 (JP) ................................ 2006-211889

(51) Int. Cl.
*G01L 9/12* (2006.01)
*H01L 21/27* (2006.01)

(52) U.S. Cl. ............................................ 438/53; 73/754

(58) Field of Classification Search .................... 73/754; 438/50, 53, 734, 735, 749, 750
See application file for complete search history.

(56) References Cited

U.S. PATENT DOCUMENTS 5,146,435 A 9/1992 Bernstein
5,408,731 A * 4/1995 Berggvist et al. ............ 29/25.41
5,589,083 A * 12/1996 Ahn et al. ....................... 216/24
6,012,335 A 1/2000 Bashir et al.
6,058,781 A * 5/2000 Kusuyama et al. ............. 73/724
6,140,689 A 10/2000 Scheiter et al.
2002/0067663 A1 6/2002 Loeppert et al.
2006/0090568 A1 5/2006 Silverbrook et al.
2006/0169049 A1* 8/2006 Matsubara ...................... 73/754
2007/0058825 A1* 3/2007 Suzuki et al. ................. 381/174
2007/0261910 A1* 11/2007 Kasai et al. .................. 181/142
2008/0121042 A1* 5/2008 Miller et al. .................... 73/649

FOREIGN PATENT DOCUMENTS

EP 1261234 A2 11/2002

(Continued)

OTHER PUBLICATIONS

Transmission letter indicating receipt of European Search Report and cited documents, date-stamped Jan. 28, 2008 (3 pages).

(Continued)

*Primary Examiner* — Lisa M Caputo
*Assistant Examiner* — Punam Roy
(74) *Attorney, Agent, or Firm* — Pillsbury Winthrop Shaw Pittman LLP

(57) ABSTRACT

A pressure sensor (e.g., a condenser microphone) includes a plate having a fixed electrode, a diaphragm having a moving electrode positioned opposite to the fixed electrode, and a support, wherein the diaphragm is subjected to displacement due to pressure variations applied thereto, and the support has a first interior wall forming a first cavity, in which the end portions of the plate are fixed, and a second interior wall, in which a step portion is formed in the thickness direction of the diaphragm in relation to the first interior wall and which forms a second cavity whose cross-sectional area is larger than the cross-sectional area of the first cavity in the plane direction of the diaphragm. The first and second cavities can be redesigned to communicate with each other via a passage, whereby it is possible to improve both of low-frequency characteristics and high-frequency characteristics in the pressure sensor.

5 Claims, 19 Drawing Sheets

(A5)

(A6)

FOREIGN PATENT DOCUMENTS

| | | | |
|---|---|---|---|
| EP | 1441561 | A2 | 7/2004 |
| EP | 1635608 | A1 | 3/2006 |
| EP | 1648195 | A1 | 4/2006 |
| EP | 1722596 | A1 | 11/2006 |
| JP | 51-60577 | | 5/1976 |
| JP | 61-172378 | | 8/1986 |
| JP | 07-128363 | | 5/1995 |
| JP | 07-167725 | | 7/1995 |
| JP | 08-083940 | | 3/1996 |
| JP | 08148696 | | 6/1996 |
| JP | 09-233798 | | 9/1997 |
| JP | 9-508777 | | 9/1997 |
| JP | 2002-520862 | | 7/2002 |
| JP | 2004-356707 | | 12/2004 |
| JP | 2004-537182 | | 12/2004 |
| JP | 2006-121616 | | 5/2006 |
| JP | 2006-157863 | | 6/2006 |
| JP | 2006-237939 | | 9/2006 |
| JP | 2007-178221 | | 7/2007 |
| WO | WO 02/45463 | | 6/2002 |
| WO | WO 2006/046926 | | 5/2006 |
| WO | WO 2007/029878 | A1 | 3/2007 |

OTHER PUBLICATIONS

European Search Report for Application No. EP07013390.5-2225, dated Jan. 16, 2008 (18 pages).

Y.B. Ning, A.W. Mitchell, R.N. Tait: Fabrication of a Silicon Micromachined Capacitive Microphone Using a Dry-Etch Process (Alberta, Canada; 1996) (3 pages).

W. Kronast, B. Muller, W. Siedel, A. Stoffel: Single-Chip Condenser Microphone Using Porous Silicon as Sacrificial Layer for the Air Gap (Furtwangen, Germany; 2001) (3 pages).

E. Cianci, V. Foglietti, G. Caliano, M. Pappalardo: Micromachined Capacitive Ultrasonic Transducers Fabricated Using Silicon on Insulator Wafers (Rome, Italy; 2002) (3 pages).

Japanese Patent Office, "Office Action": Notice of Rejection for Application No. 2006-189021 (Issued: Jun. 25, 2008).

Partial European Search Report for application No. EP07013390, dated Oct. 5, 2007 (7 pages).

U.S. Patent and Trademark Office, "Office Action" in connection with U.S. Appl. No. 12/286,870, issued Jul. 15, 2009.

* cited by examiner (A1)

(B1)

(A2)

(B2)

(A3)

(B3)

(A4)

(B4)

(A5)

(B5)

(A6)

(B6)

(A1)

(B1)

(A2)

(B2)

(A3)

(B3)

(A4)

(B4)

(A5)

(B5)

(A1)

(B1)

(A2)

(B2)

(A3)

(B3)

(A1)

(B1)

(A2)

(B2)

PRESSURE SENSOR AND MANUFACTURING METHOD THEREFOR

BACKGROUND OF THE INVENTION

1. Field of the Invention

The present invention relates to pressure sensors such as condenser microphones (or silicon capacitor microphones), which are manufactured by way of semiconductor device manufacturing processes. The present invention also relates to manufacturing methods of pressure sensors.

This application claims priority on Japanese Patent Application No. 2006-189021, Japanese Patent Application No. 2006-196578, and Japanese Patent Application No. 2006-211889, the contents of which are incorporated herein by reference.

2. Description of the Related Art

Conventionally, various types of pressure sensors such as pressure sensors of silicon capacitor types and condenser microphones, which can be manufactured by way of semiconductor device manufacturing processes, have been developed. A typical example of a pressure sensor of a silicon capacitor type is constituted of a diaphragm that vibrates due to pressure variations, a plate that is positioned opposite to the diaphragm via a dielectric such as air, and an air chamber (or a cavity). Electrostatic capacitance formed between the diaphragm and the plate varies due to vibration of the diaphragm. The pressure sensor converts variations of electrostatic capacitance into electric signals. The air chamber releases variations of internal pressure disturbing vibration of the diaphragm. Therefore, it is possible to improve output characteristics of the pressure sensor by increasing the volume of the air chamber.

Japanese Patent Application Publication No. 2004-537182 teaches a miniature silicon condenser microphone in which a cavity is formed between a recess of a substrate and a diaphragm covering the recess, wherein the internal wall of the recess is formed perpendicular to the diaphragm; hence, the opening of the recess cannot be increased to be larger than a thin film forming the diaphragm, and it is very difficult to form the cavity having a relatively large volume. Japanese Unexamined Patent Application Publication No. 2004-356707 teaches a condenser microphone in which a cavity is formed by means of a diaphragm and an internal wall of a through-hole formed in a substrate, wherein the through-hole is formed in a tapered shape whose diameter is increased in a direction opposite to a plate, so that the volume of the cavity can be increased to be larger than the volume of the cavity of the aforementioned miniature silicon condenser microphone. The tapered shape of the through-hole is formed using the lattice plane of silicon; hence, the tapered angle thereof is constant. This limits the volume of the cavity depending upon the size of a thin film forming the diaphragm; hence, it is very difficult to increase the volume of the cavity without increasing the size of the pressure sensor.

In the condenser microphone taught in Japanese Patent Application Publication No. 2004-537182 in which the cavity has a constant volume, high-frequency characteristics are degraded when the volume of the cavity is increased in order to improve low-frequency characteristics, while low-frequency characteristics are degraded when the volume of the cavity is decreased in order to improve high-frequency characteristics.

In the condenser microphone taught in Japanese Unexamined Patent Application Publication No. 2004-356707, a through-hole is formed in conformity with the two-dimensional shape of the diaphragm. This is because the through-hole serves as an introduction path for introducing an etching solution during the wet etching process, in which the prescribed portion of a sacrifice film between the thin film forming the diaphragm and the substrate in proximity to the through-hole is removed so as to form the diaphragm above the through-hole of the substrate. In the wet etching process, a part of the sacrifice film formed on the substrate is selectively removed from the substrate by way of wet etching, thus forming prescribed parts of the condenser microphone.

Due to the shape of an opening formed in the backside of the substrate opposite to the diaphragm, bubbles may occur to entirely cover the opening of the backside of the substrate during the wet etching process, thus preventing the etching solution from entering into the through-hole. Since the opening of the backside of the substrate of the aforementioned condenser microphone has a circular shape in conformity with the two-dimensional shape of the diaphragm, bubbles may easily remain in the opening due to surface tension exerted uniformly on bubbles having semispherical shapes. This makes it necessary to artificially break remaining bubbles in the aforementioned condenser microphone, which thus suffers from the complexity of the manufacturing process.

SUMMARY OF THE INVENTION

It is an object of the present invention to provide a pressure sensor, i.e., a condenser microphone that can be manufactured by way of manufacturing processes of semiconductor devices.

It is another object of the present invention to provide a pressure sensor having a relatively large volume of a cavity and a manufacturing method therefor.

It is a further object of the present invention to provide a pressure sensor, which is improved in low-frequency characteristics and high-frequency characteristics, and a manufacturing method therefor.

It is a further object of the present invention to provide a pressure sensor that can be manufactured with a simple manufacturing method.

In a first aspect of the present invention, a pressure sensor includes a plate having a fixed electrode, a diaphragm having a moving electrode positioned opposite to the fixed electrode, which is subjected to displacement due to pressure variations applied thereto, and a support having a first interior wall forming a first cavity, in which end portions of the plate are fixed, and a second interior wall, in which a step portion is formed in a thickness direction of the diaphragm in relation to the first interior wall and which forms a second cavity whose cross-sectional area is larger than the cross-sectional area of the first cavity in the plane direction of the diaphragm. That is, the cross-sectional area of the second cavity is discontinuously enlarged to be larger than the cross-sectional area of the first cavity in the plane direction of the diaphragm, and the end portions of the plate are fixed to the first interior wall forming the first cavity. This makes it possible to increase the overall volume of the cavities of the pressure sensor without bearing limitation due to the size of the plate in its plane direction and without enlarging the overall size of the pressure sensor.

In the above, the cross-sectional area of the second cavity in the plane direction of the diaphragm is enlarged in the direction opposite to the plate by way of the step portion, which the second interior wall forms in the thickness direction of the diaphragm; hence, it is possible to increase the overall volume of the cavities of the pressure sensor.

In the manufacturing method of the pressure sensor, a thin film forming the plate having the fixed electrode and a thin film forming the diaphragm are deposited on a first surface of a substrate; a first mask having a first opening is formed on a second surface opposite to the first surface of the substrate; a second mask having a second opening is formed on the second surface of the substrate, wherein the second mask covers the first mask so that the prescribed portion of the substrate just above the thin film forming the plate is exposed in the second opening; a recess is formed by performing anisotropic etching on the substrate exposed in the second opening by use of the second mask; the second mask is removed; then, anisotropic etching is performed using the first mask on the substrate exposed in the first opening such that the bottom of the recess is removed, thus forming a through-hole forming the cavity in the substrate.

When anisotropic etching is performed using the second mask on the substrate having the second opening, the recess is formed in the substrate. When anisotropic etching is performed using the first mask on the recess of the substrate, which is exposed in the first opening, and its peripheral portion such that the bottom of the recess is removed, the through-hole having the step portion is formed in the substrate in its thickness direction. The second opening is subjected to patterning such that the prescribed portion of the substrate just above the thin film forming the plate is exposed; hence, the remaining portion of the thin film forming the plate is still deposited on the substrate after completion of the formation of the through-hole. As a result, it is possible to produce a pressure sensor having a relatively large volume of cavities by way of the formation of the through-hole having the step portion in the substrate.

The manufacturing method can be modified in such a way that after the deposition of the thin film forming the plate and the thin film forming the diaphragm on the first surface of the substrate, a mask is formed on the second surface opposite to the first surface of the substrate, wherein the mask has a first opening for exposing the prescribed portion of the substrate just above the thin film forming the plate and a second opening having a slit-like shape that lies along the periphery of the first opening; anisotropic etching is performed using the mask on the substrate exposed in the first and second openings, thus forming a hole corresponding to the first opening and a recess corresponding to the second opening in the substrate; then, a wall between the hole and the recess is removed, thus forming a through-hole forming the cavity in the substrate.

When anisotropic etching is performed using the mask having the first and second openings such that the hole is formed in conformity with the first opening of the substrate, the recess is correspondingly formed in conformity with the second opening of the substrate due to the aspect-dependent etching effect. Then, the through-hole having the step portion is formed in the substrate by removing the wall between the hole and the recess. The first opening is subjected to patterning so as to expose the prescribed portion of the substrate just above the thin film forming the plate; hence, the remaining portion of the thin film forming the plate is still deposited on the substrate after completion of the formation of the through-hole. As a result, it is possible to produce a pressure sensor having a relatively large volume of the cavity by way of the formation of the through-hole having the step portion in the substrate.

In the above, it is possible to form a plurality of second openings whose widths are reduced in the direction departing from the first opening, wherein the wall between the hole and its adjacent recess as well as the wall between the recesses are simultaneously removed. Since the widths of the second openings are reduced in the direction departing from the first opening, the depths of the recesses (corresponding to the second openings) are reduced in the direction departing from the first opening. This realizes the formation of the through-hole having multiple step portions by removing the walls in the substrate; thus, it is possible to produce a pressure sensor having a relatively large volume of the cavity by way of the formation of the through-hole having multiple step portions in the substrate.

In the above, the hole and the recesses are each formed in a reversely tapered shape in the direction from the second surface to the first surface of the substrate, whereby thin portions of the walls are easily isolated from the substrate so that the walls can be removed from the substrate with ease.

The manufacturing method can be further modified in such a way that after the deposition of the thin film forming the plate and the thin film forming the diaphragm on first surface of the substrate, a mask is formed on the second surface opposite to the first surface of the substrate, wherein the mask has a first opening for exposing the prescribed portion of the substrate just above the thin film forming the plate and a second opening having a slit-like shape interconnected to the first opening; the, anisotropic etching is performed using the mask on the substrate exposed in the first and second openings, thus forming a through-hole forming the cavity in the substrate.

When anisotropic etching is performed using the mask having the first and second openings such that the hole is formed in conformity with the first opening in the substrate, the recess having the slit-like shape is formed in conformity with the second opening due to the aspect-dependent etching effect in the substrate. The recess is interconnected to the hole of the substrate so that the through-hole has a step portion. The first opening is subjected to patterning so as to expose the prescribed portion of the substrate just above the thin film forming the plate; therefore, the remaining portion of the thin film forming the plate is still deposited on the substrate after completion of the formation of the through-hole. Thus, it is possible to produce a pressure sensor having a relatively large volume of the cavity by way of the formation of the through-hole having the step portion in the substrate.

In a second aspect of the present invention, a pressure sensor includes a plate having a fixed electrode, a diaphragm that has a moving electrode positioned opposite to the fixed electrode and that is subjected to displacement due to pressure variations applied thereto, a support having an interior wall fixed to end portions of the plate, in which a first cavity is formed inwardly of the interior wall of the support and the diaphragm, and a sub-cavity forming portion for forming a second cavity communicating with the first cavity via a passage having an opening communicating the first cavity.

When the frequency of pressure variations increases, the diaphragm is subjected to displacement in response to high frequency, so that the internal pressure of the first cavity varies at high frequencies. This increases the velocity of an air flow of the passage. When the frequency of pressure variations decreases, the diaphragm is subjected to displacement at low frequency, so that the internal pressure of the first cavity varies at low frequency. This decreases the velocity of an air flow of the passage. Herein, the resistance of the passage increases in response to the velocity of the air flow. For this reason, when the frequency of pressure variations increases, substantially no air flow occurs between the first cavity and the second cavity; hence, the overall volume of the cavity of the pressure sensor can be substantially regarded as the volume of the first cavity. When the frequency of pressure variations decreases, an air flow occurs between the first cavity and the second cavity; hence, the overall volume of the cavity of the pressure sensor can be substantially regarded as the sum of the volumes of the first and second cavities. Since the overall volume of the cavity of the pressure sensor is varied in response to the frequency of pressure variations, it is possible to improve both of high-frequency characteristics and low-frequency characteristics of the pressure sensor.

In the above, the sub-cavity forming portion is arranged in the support, wherein the passage and the second cavity are formed inwardly of a recess of the support so as to simplify the constitution of the pressure sensor.

In addition, the sub-cavity forming portion forms a plurality of second cavities and a plurality of passages having different resistances, via which the first cavity communicates with the second cavities, by which it is possible to delicately adjust the output characteristics of the pressure sensor by individually setting the resistances of the passages in response to required output characteristics.

Furthermore, it is possible to form a plurality of second cavities having different volumes. This makes it possible to delicately adjust output characteristics of the pressure sensor by individually setting the volumes of the second cavities in response to required output characteristics.

In the manufacturing method of the pressure sensor, a thin film forming the plate and a thin film forming the diaphragm are deposited on a first surface of a substrate forming the support; a mask is formed on a second surface opposite to the first surface of the substrate, wherein the mask includes a first opening for exposing the prescribed portion of the substrate just above the thin film forming the plate and the thin film forming the diaphragm, a second opening having a slit-like shape, and a third opening having a slit-like shape, which is elongated from the first opening to the second opening; and anisotropic etching is performed using the mask on the substrate so as to form a hole in conformity with the first opening of the substrate, a first recess in conformity with the second opening on the second surface of the substrate, and a second recess, which is elongated from the hole to the first recess, in conformity with the third opening on the second surface of the substrate, thus forming a cavity forming portion in the substrate.

In the mask, the second opening and third opening have slit-like shapes, and the third opening is elongated from the first opening to the second opening. When anisotropic etching is performed using the mask having the first, second, and third openings on the substrate such that the hole is formed in conformity with the first opening in the substrate, it is possible to form the first cavity in correspondence with the hole of the substrate, and it is possible to form the sub-cavity forming portion (constituted of the first and second recesses) on the second surface of the substrate in correspondence with the second and third openings due to the aspect-dependent etching effect. That is, by way of simple processes using semiconductor device manufacturing processes, it is possible to produce a pressure sensor having the first cavity and the second cavity, which communicates with the first cavity via the passage.

Incidentally, the manufacturing method can be modified such that the anisotropic etching is performed using the mask including a plurality of second openings on the substrate so as to form a plurality of first recesses in the substrate; then, at least one wall between the first recesses positioned adjacent to each other is removed. That is, it is possible to increase the volume of the second cavity by connecting the first recesses.

In a third aspect of the present invention, a pressure sensor includes a substrate having a first surface and a second surface, which are positioned opposite to each other, a plate having a fixed electrode, which is constituted of a thin film formed on the first surface of the substrate, a diaphragm that has a moving electrode positioned opposite to the fixed electrode and that is constituted of a thin film formed on the first surface of the substrate and is subjected to displacement due to pressure variations applied thereto, a support constituted of a thin film, which is composed of a material that can be selectively removed from the substrate by way of wet etching and which is formed on the first surface of the substrate, wherein the support supports the plate such that a gap is formed between the fixed electrode and the moving electrode, a through-hole that is formed to run through the substrate in its thickness direction so as to expose the diaphragm and that has a first opening, which is formed on the first surface of the substrate in conformity with the two-dimensional shape of the diaphragm, and a second opening whose shape is substantially identical to the shape of the first opening and which is formed on the second surface of the substrate, and a recess, which is formed on the second surface of the substrate and which forms a third opening communicating with the second opening in its periphery.

In the above, the through-bole and the recess form an inlet of an etching solution by way of wet etching, wherein the through-hole forms the second opening on the second surface of the substrate in conformity with the two-dimensional shape of the diaphragm, and the recess forms the third opening projecting externally of the periphery of the second opening on the second surface of the substrate. That is, the second and third openings form an inlet of an etching solution on the second surface of the substrate. Even when bubbles occur to entirely cover the inlet on the second surface of the substrate during wet etching, surface tensions are unevenly distributed to bubbles due to the third opening, so that bubbles may be easily burst. This simplifies the manufacturing process of the pressure sensor. Since the second opening of the second surface of the substrate is formed using the recess that is not opened in the first surface of the substrate, only the first opening is formed on the first surface of the substrate in conformity with the two-dimensional shape of the diaphragm; hence, it is possible to prevent output characteristics of the pressure sensor from being degraded.

The pressure sensor can be modified to include a first through-hole and second through-hole, both of which are formed to run through the substrate in its thickness direction, in addition to the substrate, plate, diaphragm, and support. The first through-hole exposing the diaphragm has a first opening, which is formed on the first surface of the substrate in conformity with the two-dimensional shape of the diaphragm, and a second opening whose shape is substantially identical to the shape of the first opening and which is formed on the second surface of the substrate. The second through-hole forms a third opening communicating with the first opening in its periphery on the first surface of the substrate and a fourth opening whose shape is substantially identical to the shape of the third opening on the second surface of the substrate.

In the above, the first and second through-holes form an inlet of an etching solution by way of wet etching, wherein the first through-hole forms the second opening on the second surface of the substrate in conformity with the two-dimensional shape of the diaphragm, while the second through-hole forms the fourth opening communicating with the periphery of the second opening on the second surface of the substrate. The second and fourth openings of the second surface of the substrate form an inlet of an etching solution. Even when bubbles occur to entirely cover the inlet during wet etching, surface tensions are unevenly distributed to bubbles due to the fourth opening; hence, bubbles may be easily burst. This simplifies the manufacturing process of the pressure sensor. In addition, the first and second through-holes form the first and third openings on the first surface of the substrate, wherein the first opening is basically shaped in conformity with the two-dimensional shape of the diaphragm. This makes it possible to prevent output characteristics of the pressure sensor from being degraded by appropriately designing the shape of the second through-hole forming the third opening.

In a manufacturing method of the pressure sensor, a sacrifice film forming the support is deposited on a first surface of a substrate by way of wet etching using a material that can be selectively removed from the substrate; a thin film forming the diaphragm is deposited on the sacrifice film; a mask is formed on a second surface opposite to the first surface of the substrate, wherein the mask has a first opening that is formed to expose the prescribed portion of the substrate just above the thin film in conformity with the two-dimensional shape of the diaphragm and a second opening having a slit-like shape that is elongated externally of the periphery of the first opening; anisotropic etching is performed using the mask on the substrate so as to form a through-hole in correspondence with the first opening of the substrate and a recess in correspondence with the second opening of the substrate; then, wet etching is performed using an etching solution, which is supplied from the through-hole of the substrate, so as to selectively remove the sacrifice film.

The manufacturing method can be modified such that anisotropic etching is performed using the mask on the substrate so as to form a first through-hole in correspondence with the first opening of the substrate and a second through-hole in correspondence with the second opening of the substrate; then, wet etching is performed using an etching solution, which is supplied from the first and second through-holes of the substrate, so as to selectively remove the sacrifice film.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

The present invention will be described in further detail by way of examples with reference to the accompanying drawings.

1. First Embodiment

Figure 1A:
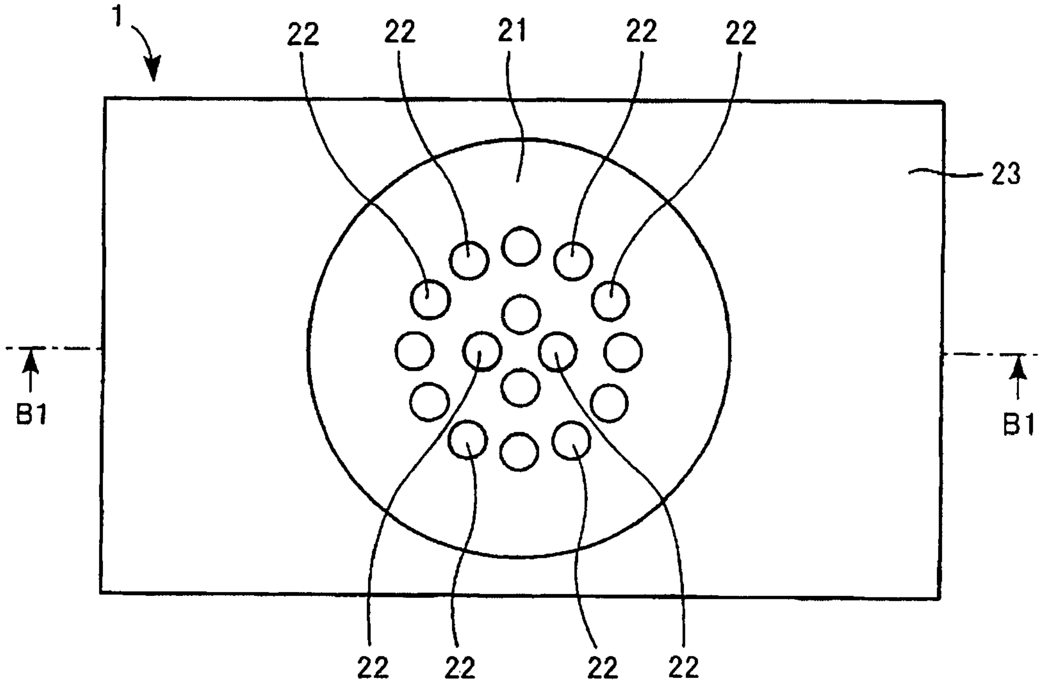
FIG. 1A is a plan view showing the constitution of a condenser microphone in accordance with a first embodiment of the present invention.
Figure 1B:
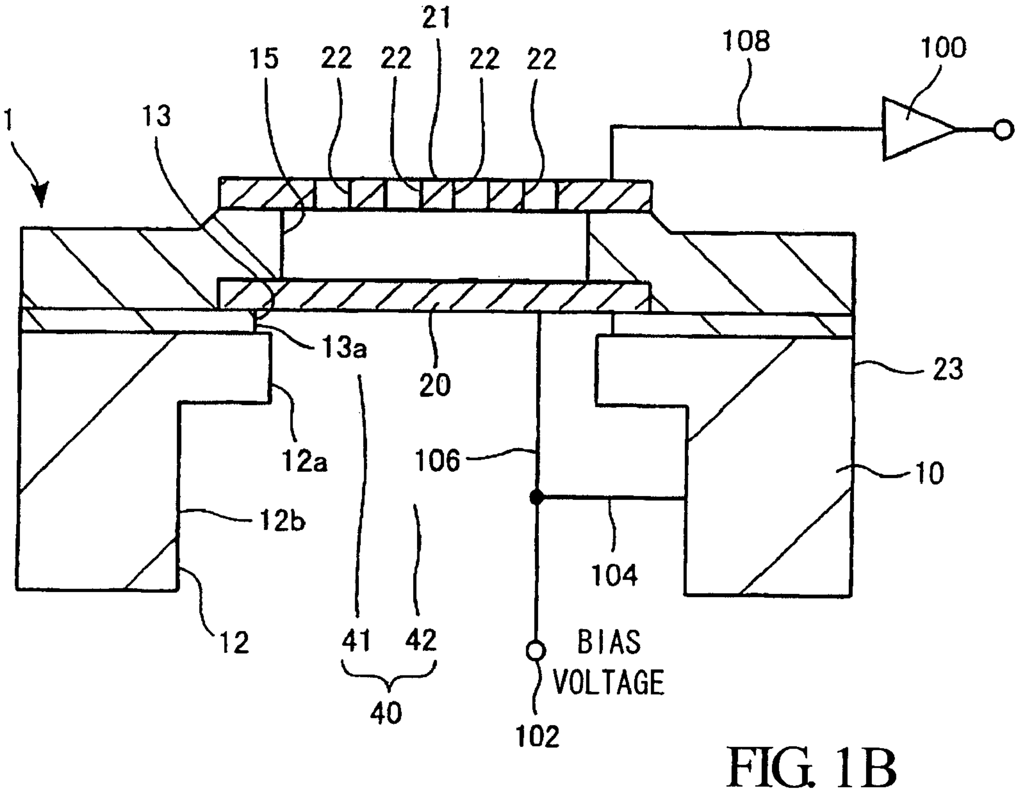
FIG. 1B is a cross-sectional view taken along line B1-B1 in FIG. 1A.

FIGS. 1A and 1B show the constitution of a condenser microphone 1 such as a silicon capacitor microphone that is manufactured by way of the semiconductor device manufacturing process and a pressure sensor that converts sound waves transmitted to a plate 21 into electric signals.

A sensing portion of the condenser microphone 1 has a laminated structure composed of a substrate 10, a first film, a second film, a third film, and a fourth film. The substrate 10 is a mono-crystal silicon substrate, in which a through-hole 12 having a step portion is formed in a thickness direction.

The first film is an insulating thin film composed of silicon dioxide. The first film supports the second film above the substrate 10 so as to form a gap between a diaphragm 20 and the substrate 10. A circular opening 13 is formed in the first film.

The second film is a conductive thin film composed of polysilicon doped with phosphorus impurities (P). The prescribed portion of the second film that is not fixed to the third film forms the diaphragm 20. The diaphragm 20 is not fixed to either the first film or the third film, wherein it serves as a moving electrode that vibrates due to sound waves. The diaphragm 20 has a circular shape covering the opening 13 of the first film.

Similar to the first film, the third film is an insulating thin film composed of silicon dioxide. The third film insulates the fourth film from the second film having a conductivity so as to support the fourth film above the second film. A circular opening 15 is formed in the third film.

Similar to the second film, the fourth film is a conductive thin film composed of polysilicon doped with phosphorus impurities (P). The prescribed portion of the fourth film that is not fixed to the third film forms a plate 21. A plurality of holes 22 are formed in the plate 21.

A support 23 is constituted of the substrate 10, the first film, the third film, the second film, and the prescribed portion of the fourth film that is not fixed to the third film. A back cavity 40 constituted of a first cavity 41 and second cavity 42 is formed in the support 23. The back cavity 40 releases pressure that is applied to the diaphragm 20 in a direction opposite to the propagation direction of sound waves. The first cavity 41 is formed inwardly of an interior wall 12*a* of the substrate 10, which is positioned in proximity to the plate 21, and inwardly of an interior wall 13*a* of the opening 13 of the second film. The second cavity 42 is formed inwardly of an interior wall 12*b* of the substrate 10, which is positioned opposite to the plate 21. The cross-sectional area of the second cavity 42 lying in the plane direction of the diaphragm 20 is larger than that of the first cavity 41. In the claim language, both of the interior wall 12*a* of the substrate 10 and the interior wall 13*a* of the second film are defined as a first interior wall, and the interior wall 12*b* of the substrate 10 is defined as a second interior wall.

A detecting portion of the condenser microphone 1 will be described by way of the circuitry shown in FIG. 1B, in which the diaphragm 20 is connected to a bias voltage source. Specifically, leads 104 and 106 are connected to a terminal 102 of the bias voltage source, wherein the lead 104 is connected to the substrate 10, and the lead 106 is connected to the second film, so that both of the diaphragm 20 and the substrate 10 are placed at the substantially same potential. In addition, the plate 21 is connected to an input terminal of an operational amplifier 100. That is, a lead 108 connected to the input terminal of the operational amplifier 100 is connected to the fourth film. The operational amplifier 100 has high input impedance.

Next, the operation of the condenser microphone 1 will be described. When sound waves are transmitted to the diaphragm 20 via the holes 22 of the plate 21, the diaphragm 20 vibrates due to sound waves. The vibration of the diaphragm

20 causes variations of the distance between the diaphragm 20 and the plate 21, thus varying electrostatic capacitance formed between the diaphragm 20 and the plate 21.

Since the plate 21 is connected to the operational amplifier 100 having high input impedance, a very small amount of electric charge existing in the plate 21 moves toward the operational amplifier 100 irrespective of variations of electrostatic capacitance between the diaphragm 20 and the plate 21. Therefore, it can be presumed that electric charges existing in the plate 21 and the diaphragm 20 may not change. This makes it possible to translate variations of electrostatic capacitance between the diaphragm 20 and the plate 21 into potential variations of the plate 21. Thus, the condenser microphone 1 is capable of producing electric signals based on very small variations of electrostatic capacitance between the diaphragm 20 and the plate 21. That is, the condenser microphone 1 converts variations of sound pressure applied to the diaphragm 20 into variations of electrostatic capacitance, which are then converted into voltage variations, based on which electric signals are produced in response to variations of sound pressure.

Next, a manufacturing method of the condenser microphone 1 will be described with reference to FIGS. 2A to 2F and FIGS. 3A to 3F.

Figure 2A:
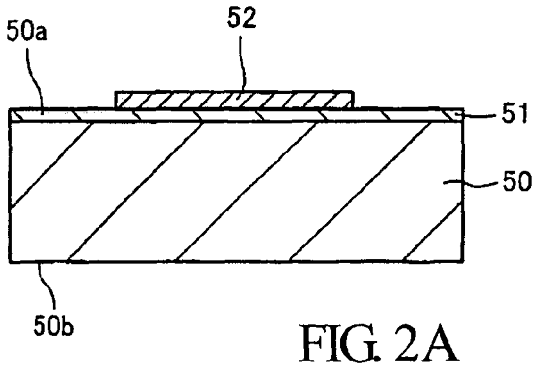
FIG. 2A is a cross-sectional view for explaining a first step of a manufacturing method of the condenser microphone.
Figure 2B:
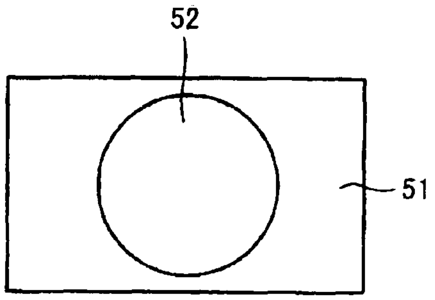
FIG. 2B is a plan view corresponding to FIG. 2A.

In a first step of the manufacturing method (i.e., (A1) and (B1) shown in FIGS. 2A and 2B), a first film 51 is deposited on a wafer 50 forming the substrate 10 (see FIG. 1B). That is, silicon dioxide is deposited on the wafer 50 composed of monocrystal silicon by way of plasma chemical vapor deposition (or plasma CVD), thus forming the first film 51.

Next, a second film 52 is deposited on the first film 51. That is, phosphorus-doped polysilicon is deposited on the first film 51 by way of decompression CVD, thus forming the second film 52. Next, a photoresist film is applied to the entire surface of the second film 52; then, a resist pattern is formed by way of photolithography for performing exposure and development using a prescribed resist mask. Then, the second film 52 is selectively removed by way of anisotropic etching such as reactive ion etching (RIE), thus forming the second film 52 having a circular shape.

Figure 2C:
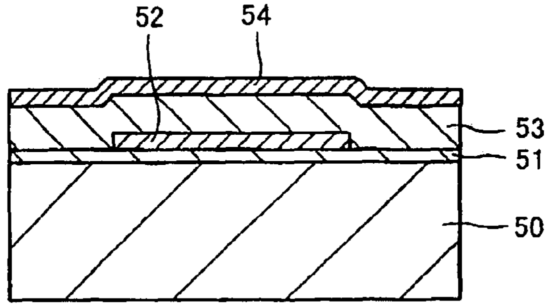
FIG. 2C is a cross-sectional view for explaining a second step of the manufacturing method of the condenser microphone.
Figure 2D:
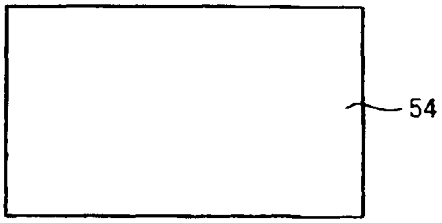
FIG. 2D is a plan view corresponding to FIG. 2C.

In a second step of the manufacturing method (i.e., (A2) and (B2) shown in FIGS. 2C and 2D), a third film 53 is deposited on the second film 52. That is, silicon dioxide is deposited on the second film 52 by way of plasma CVD, thus forming the third film 53.

Figure 2E:
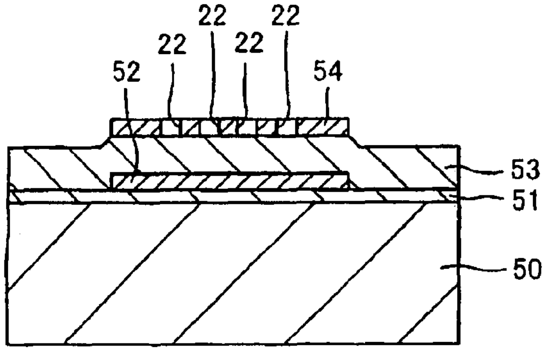
FIG. 2E is a cross-sectional view for explaining a third step of the manufacturing method of the condenser microphone.
Figure 2F:
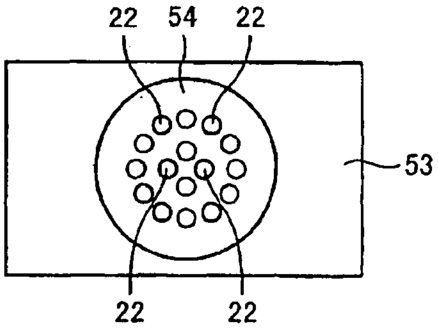
FIG. 2F is a plan view corresponding to FIG. 2E.

In a third step of the manufacturing method (i.e., (A3) and (B3) shown in FIGS. 2E and 2F), a fourth film 54 is deposited on the third film 53. That is, phosphorus-doped polysilicon is deposited on the third film 53 by way of decompression CVD, thus forming the fourth film 54. Next, a photoresist film is applied to the entire surface of the fourth film 54; then, a resist pattern is formed by way of photolithography for performing exposure and development using a prescribed resist mask. Then, the fourth film 54 is selectively removed by way of anisotropic etching such as RIE, thus forming the fourth film 54 having a circular shape and the plurality of holes 22.

Figure 3A:
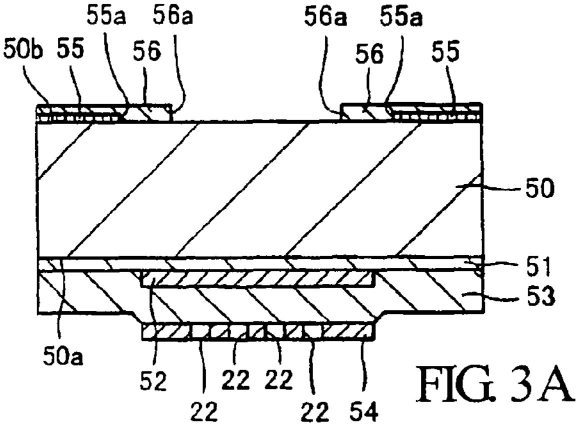
FIG. 3A is a cross-sectional view for explaining a fourth step of a manufacturing method of the condenser microphone.
Figure 3B:
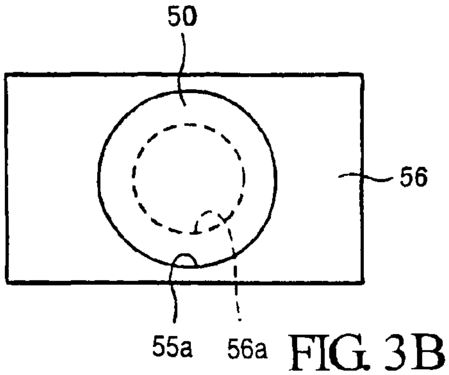
FIG. 3B is a plan view corresponding to FIG. 3A.

In a fourth step of the manufacturing method (i.e., (A4) and (B4) shown in FIGS. 3A and 3B), a first mask 55 having a first opening 55*a* is formed on a second surface 50*b* opposite to a first surface 50*a* of the wafer 50 on which the first film 51, the second film 52, the third film 53, and the fourth film 54 are laminated. That is, the first mask 55 composed of a metal is adhered to the wafer 50 by use of the adhesive. It is preferable that the adhesive be an organic adhesive, and it is preferable that the first mask 55 be composed of nickel or chromium. Incidentally, the first mask 55 can be composed of any types of materials as long as it can be selectively removed together with a second mask 56. Alternatively, the first mask 55 can be formed by performing metal plating on the wafer 50.

Next, a second mask 56 having a second opening 56*a* is formed on the second surface 50*b* of the wafer 50 and the first mask 55. That is, a photoresist film is applied to the entire surface corresponding to the second surface 50*b* of the wafer 50 and the first mask 55; then, the second mask 56 is formed by way of photolithography for performing exposure and development using a prescribed resist mask. Herein, the second opening 56*a* exposes the prescribed portion of the wafer 50 just above the second film 52 and the fourth film 54 in the first opening 55*a*.

Figure 3C:
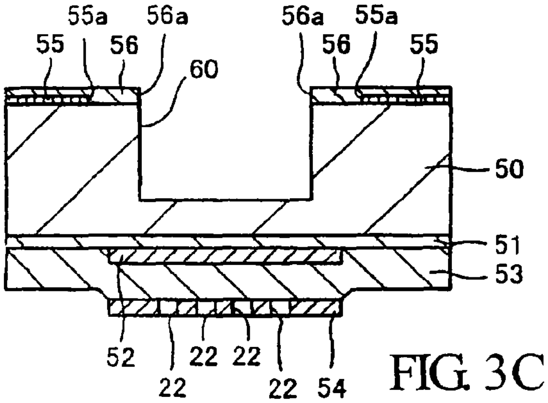
FIG. 3C is a cross-sectional view for explaining a fifth step of the manufacturing method of the condenser microphone.
Figure 3D:
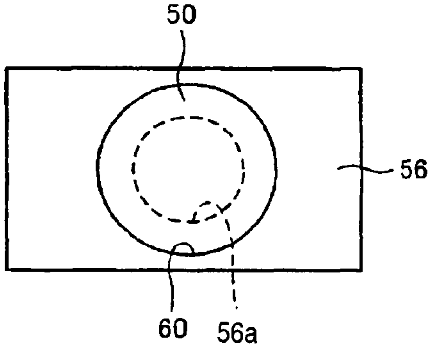
FIG. 3D is a plan view corresponding to FIG. 3C.

In a fifth step of the manufacturing method (i.e., (A5) and (B5) shown in FIGS. 3C and 3D), the prescribed portion of the wafer 50 exposed inwardly of the second opening 56*a* is subjected to anisotropic etching using the second mask 56, thus forming a recess 60 in the wafer 50. That is, the wafer 50 is selectively removed by way of Deep-RIE, thus forming the recess 60 in the wafer 50.

Figure 3E:
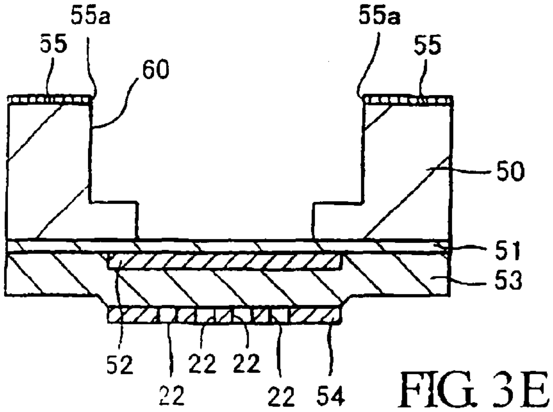
FIG. 3E is a cross-sectional view for explaining a sixth step of the manufacturing method of the condenser microphone.
Figure 3F:
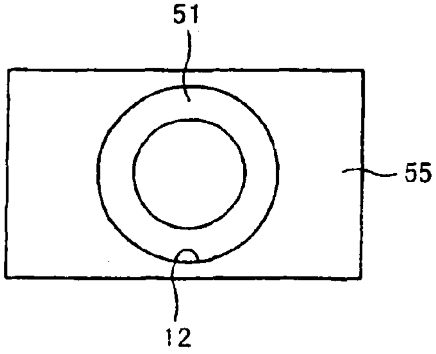
FIG. 3F is a plan view corresponding to FIG. 3E.

In a sixth step of the manufacturing method (i.e., (A6) and (B6) shown in FIGS. 3E and 3F), the second mask 56 is removed. That is, the second mask 56 is removed by use of a resist peeling solution such as NMP (i.e., N-methyl-2-pyrolidone).

Next, the prescribed portion of the wafer 50 exposed inwardly of the first opening 55*a* is subjected to anisotropic etching using the first mask 55, thus forming the through-hole 12 having a step portion in the wafer 50. That is, the wafer 50 is selectively removed such that the bottom of the recess 60 disappears by way of Deep-RIE, thus forming the through-hole 12 having the step portion in the wafer 50. Herein, the prescribed portion of the first film 51 just above the second film 52 and the fourth film 54 is exposed inwardly of the through-hole 12. The remaining portions of the second film 52 and the fourth film 54 are still deposited in the surrounding area of an opening of the second surface 50*b* of the wafer 50 after the completion of the formation of the through-hole 12.

Next, the first film 51 and the third film 53, both of which are silicon oxide films, are selectively removed by way of isotropic etching (e.g., wet etching) using an etching solution such as buffered hydrofluoric acid (or Buffered HF) or by way of the combination of isotropic etching and anisotropic etching. Herein, the etching solution is supplied via the holes 22 of the fourth film 54 and the through-hole 12 of the wafer 50 so as to dissolve the first film 51 and the third film 53. By appropriately designing the shapes and arrangements of the holes 22 and the through-hole 12, it is possible to form the openings 13 and 15 in the first film 51 and the third film 53. Thus, it is possible to form the sensing portion constituted of the diaphragm 20, the plate 21, and the support 23 (see FIGS. 1A and 1B).

Thereafter, other steps such as dicing and packaging are performed so as to completely produce the condenser microphone 1.

The first embodiment can be modified in a variety of ways; hence, variations will be described below.

(a) First Variation

Figure 4A:
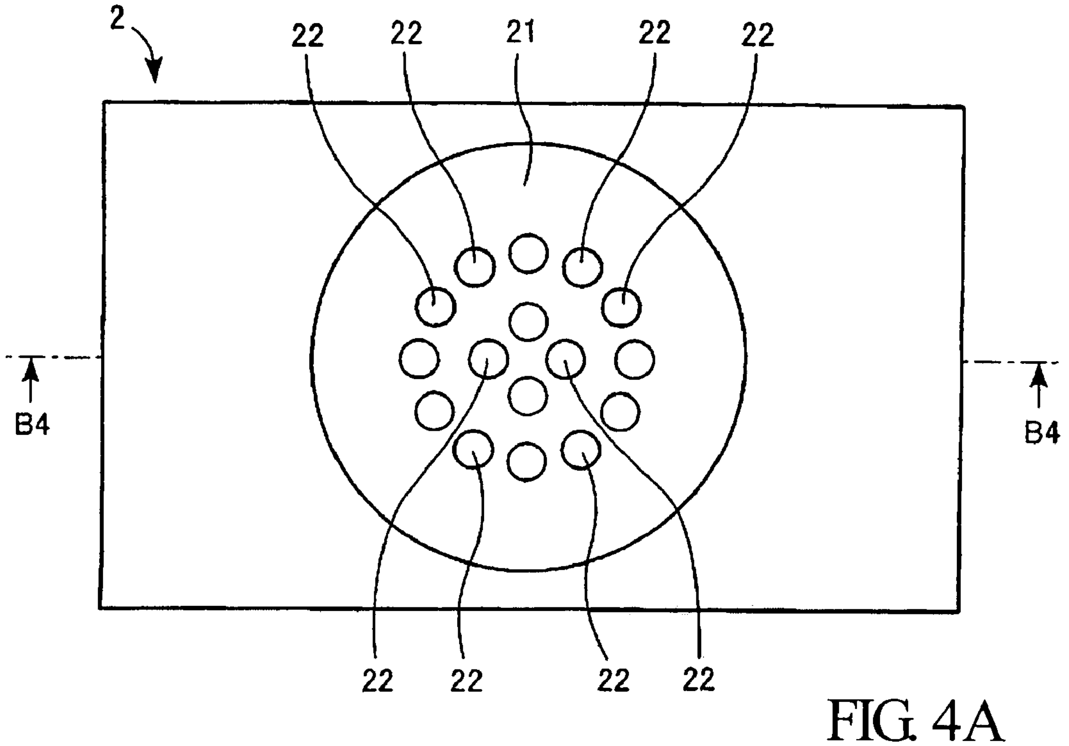
FIG. 4A is a plan view showing the constitution of a condenser microphone according to a first variation of the first embodiment.
Figure 4B:
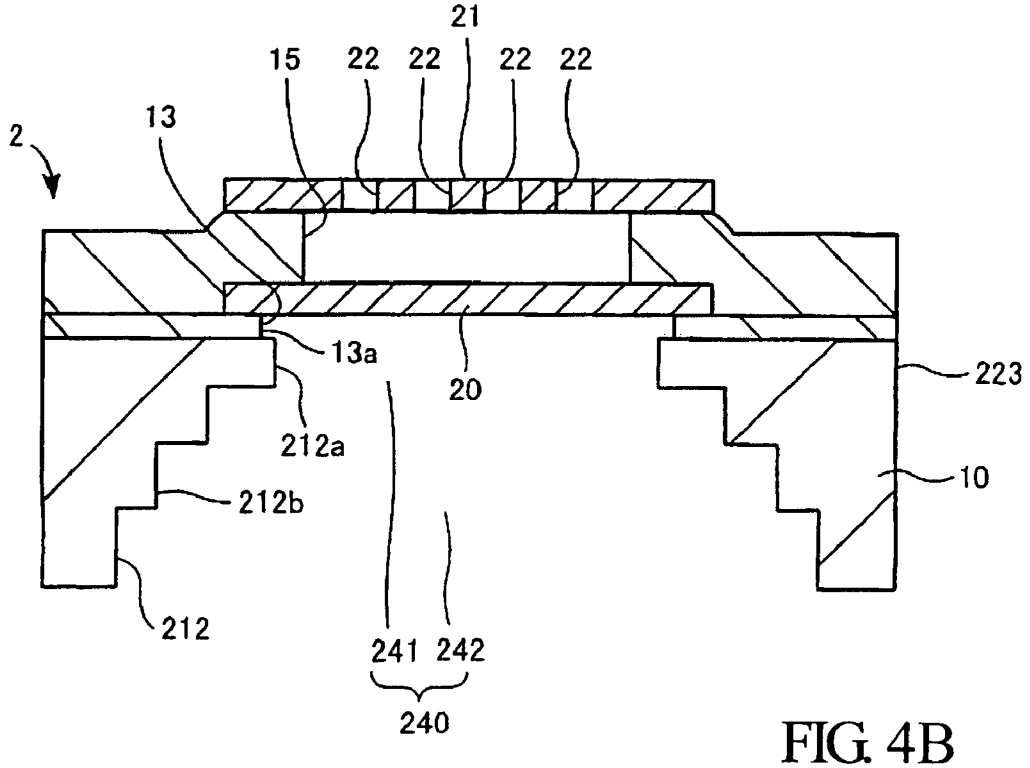
FIG. 4B is a cross-sectional view taken along line B4-B4 in FIG. 4A.

FIGS. 4A and 4B show the constitution of a condenser microphone 2 in accordance with a first variation of the first embodiment. The sensing portion of the condenser microphone 2 differs from the sensing portion of the condenser microphone 1 in terms of the shape of the substrate 10. Specifically, a through-hole 212 having multiple step portions is formed in the substrate 10 of the condenser microphone 2. Herein, a support 223 is constituted of the substrate 10, the first film, the third film, and the prescribed portions of the second and fourth films that are not fixed to the third film.

A back cavity 240 constituted of a first cavity 241 and a second cavity 242 is formed in the support 223. The first cavity 241 is formed inwardly of an interior wall 212*a* of the substrate 10 positioned in proximity to the plate 21 and inwardly of the interior wall 13*a* of the opening 13 of the second film. The second cavity 242 is formed inwardly of an interior wall 212*b* of the substrate 10 positioned opposite to the plate 21. The interior wall 212*b* of the substrate 10 forms a step portion lying in the thickness direction of the diaphragm 20. Thus, the cross-sectional area of the second cavity 242 lying in the thickness direction of the diaphragm 20 is enlarged discontinuously in a direction extending oppositely from the plate 21. In the claim language, the interior wall 212*a* of the substrate 10 and the interior wall 13*a* of the second film are both defined as a first interior wall, and the interior wall 212*b* of the substrate 10 is defined as a second interior wall.

The detecting portion of the condenser microphone 2 is substantially identical to the detecting portion of the condenser microphone 1. Hence, the operation of the condenser microphone 2 is substantially identical to the operation of the condenser microphone 1. For the sake of convenience, the detailed description regarding the operation of the condenser microphone 2 will be omitted.

Next, a manufacturing method of the condenser microphone 2 will be described with reference to FIGS. 5A to 5H.

Figure 5A:
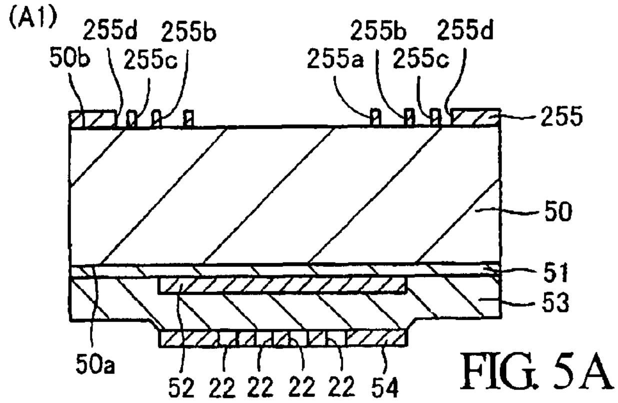
FIG. 5A is a cross-sectional view for explaining a first step of a manufacturing method of the condenser microphone.
Figure 5B:
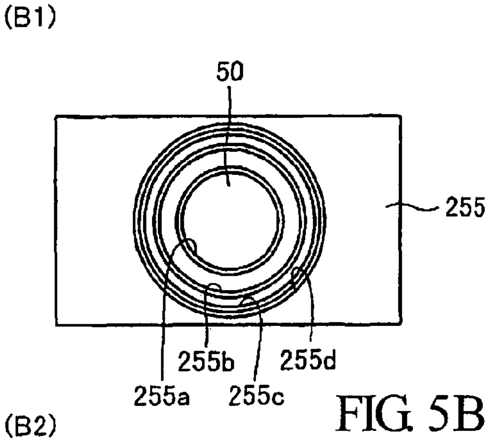
FIG. 5B is a plan view corresponding to FIG. 5A.

Similar to the manufacturing method of the condenser microphone 1, in a first step (i.e., (A1) and (B1) shown in FIGS. 5A and 5B) of the manufacturing method of the condenser microphone 2, the first film 51, the second film 52, the third film 53, and the fourth film 54 are deposited on the first surface 50*a* of the wafer 50.

Next, a mask 255 having openings 255*a*, 255*b*, 255*c*, and 255*d* is formed on the second surface 50*b* of the wafer 50. That is, a photoresist film is applied entirely to the second surface 50*b* of the wafer 50; then, the mask 255 is formed by way of photolithography for performing exposure and development using a prescribed resist mask. The opening 255*a* has a circular shape that exposes a prescribed portion of the wafer 50 just above the second film 52 and the fourth film 54. The openings 255*b*, 255*c*, and 255*d* each having a ring shape are sequentially expanded in the circumferential periphery of the opening 255*a*. Each of the ring-shaped openings 255*b*, 255*c*, and 255*d* forms a slit whose width in a radial direction is smaller than the diameter of the opening 255*a*. In view of the radial direction, the width of the opening 255*b* is smaller than the width of the opening 255*b*; and the width of the opening 255*d* is smaller than the width of the opening 255*c*.

Figure 5C:
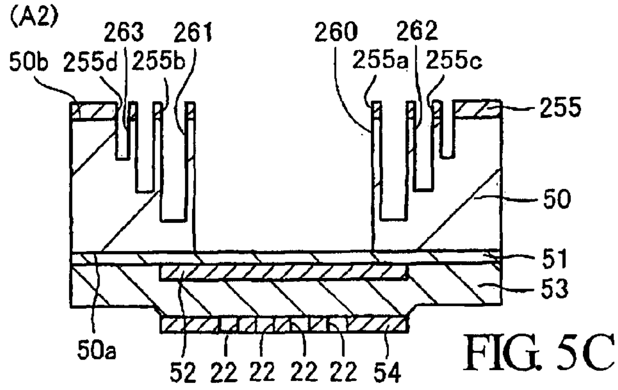
FIG. 5C is a cross-sectional view for explaining a second step of the manufacturing method of the condenser microphone.
Figure 5D:
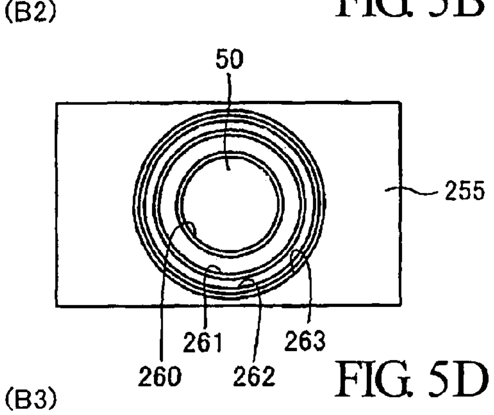
FIG. 5D is a plan view corresponding to FIG. 5C.

In a second step of the manufacturing method (i.e., (A2) and (B2) shown in FIGS. 5C and 5D), the wafer 50 is subjected to anisotropic etching using the mask 255, thus forming a hole 260 and recesses 261, 262, and 263 in the wafer 50. Specifically, the prescribed portion of the wafer 50, which is exposed from the mask 255, is selectively removed by way of anisotropic etching such as Deep-RIE. The anisotropic etching is continuously performed until the hole 260 is completely formed to positionally match the opening 255*a* in the wafer 50. Each of the widths of the openings 255*b*, 255*c*, and 255*d* in a radial direction is smaller than the diameter of the opening 255*a*. Due to the aspect-dependent etching effect, the recesses 261, 262, and 263 are respectively formed to positionally match the openings 255*b*, 255*c*, and 255*d* in the wafer 50. Since the width of the opening 255*c* is smaller than the width of the opening 255*b* in the radial direction, the depth of the recess 262 is smaller than the depth of the recess 261 in the thickness direction of the wafer 50. Since the width of the opening 255*d* is smaller than the width of the opening 255*c* in the radial direction, the depth of the recess 263 is smaller than the depth of the recess 262 in the thickness direction of the wafer 50.

Figure 5E:
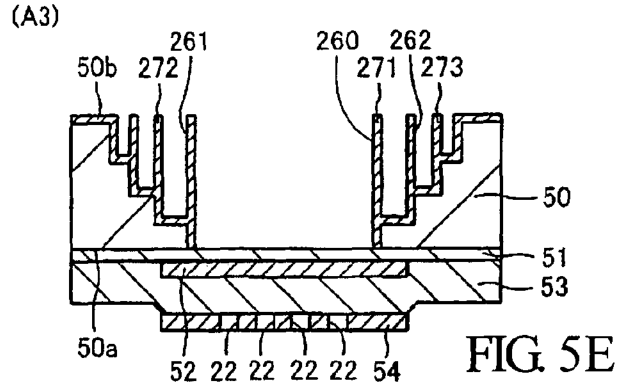
FIG. 5E is a cross-sectional view for explaining a third step of the manufacturing method of the condenser microphone.
Figure 5F:
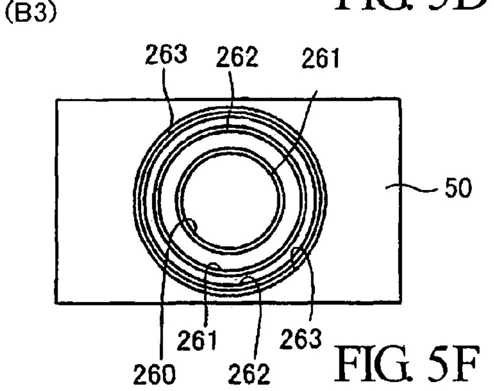
FIG. 5F is a plan view corresponding to FIG. 5E.
Figure 5G:
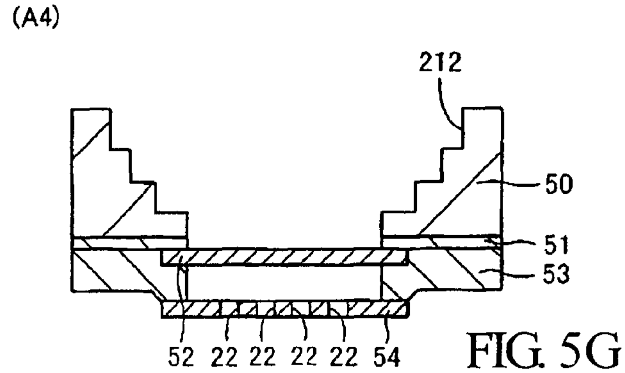
FIG. 5G is a cross-sectional view for explaining a fourth step of the manufacturing method of the condenser microphone.
Figure 5H:
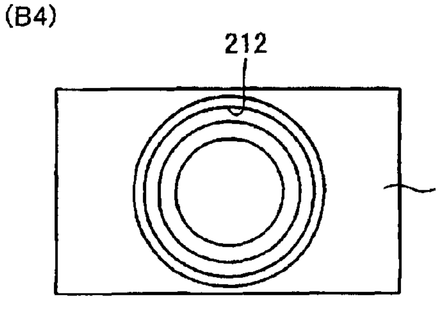
FIG. 5H is a plan view corresponding to FIG. 5G.

As shown in FIGS. 5E and 5F, a wall 271 is formed between the hole 260 and the recess 261; a wall 272 is formed between the recesses 261 and 262; and a wall 273 is formed between the recesses 262 and 263. The walls 271, 272, and 273 are removed as shown in FIGS. 5G and 5H. Specifically, the second surface 50*b* of the wafer 50 composed of monocrystal silicon is subjected to thermal oxidation, thus transforming the walls 271, 272, and 273 into silicon oxide; then, wet etching is performed using an etching solution such as buffered hydrofluoric acid so as to selectively remove the walls 271, 272, and 273 together with the transformed portion of the second surface 50*b* of the wafer 50. As a result, it is possible to form the through-hole 212 having multiple step portions in the wafer 50, wherein the prescribed portion of the first film 51 just above the second film 52 and the fourth film 54 is exposed in the through-hole 212. The remaining portions of the second film 52 and the fourth film 54 are still deposited in the surrounding area of the opening in the second surface 50*b* of the wafer 50 after completion of the formation of the through-hole 212.

Steps following the aforementioned steps of the manufacturing method of the condenser microphone 2 are substantially identical to those of the manufacturing method of the condenser microphone 1.

(b) Second Variation

In the manufacturing method of the condenser microphone 2 according to the first variation of the first embodiment, the walls 271, 272, and 273 of the wafer 50 are selectively removed by way of transformation. Of course, the process for selectively removing walls is not necessarily limited to the aforementioned process.

Next, a manufacturing method according to a second variation of the first embodiment will be described with respect to the process for selectively removing walls.

Figure 6A:
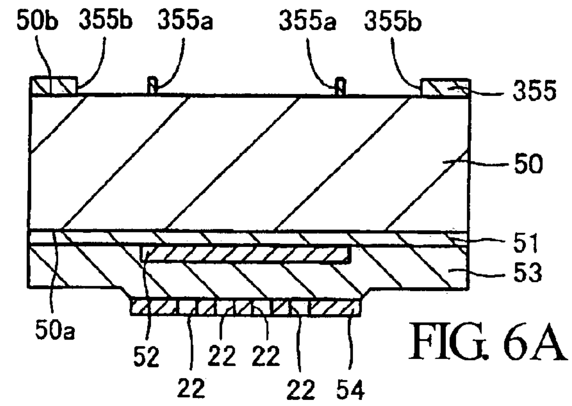
FIG. 6A is a cross-sectional view for explaining a first step of a manufacturing method of a condenser microphone according to a second variation of the first embodiment.
Figure 6B:
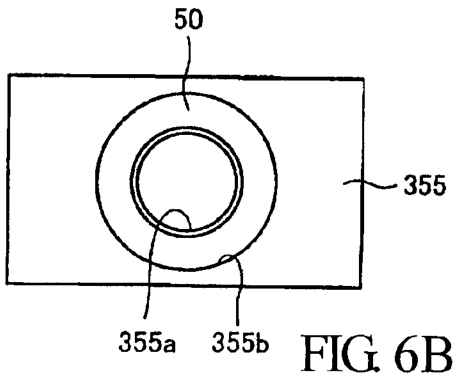
FIG. 6B is a plan view corresponding to FIG. 6A.

Similar to the manufacturing method of the condenser microphone 1, in a first step (i.e., (A1) and (B1) shown in FIGS. 6A and 6B) of the manufacturing method of the condenser microphone according to the second variation of the first embodiment, the first film 51, the second film 52, the third film 53, and the fourth film 54 are deposited on the first surface 50*a* of the wafer 50.

Next, a mask 355 having openings 355*a* and 355*b* is formed on the second surface 50*b* of the wafer 50. That is, a photoresist mask is applied entirely to the second surface 50*b* of the wafer 50; then, the mask 355 is formed by way of photolithography for performing exposure and development using a prescribed resist mask. The opening 355*a* has a circular shape that exposes the prescribed portion of the wafer 50 just above the second film 52 and the fourth film 54. The opening 355*b* has a ring shape that is formed in the circumferential periphery of the opening 355*a*, wherein the opening 355*b* forms a slit whose width in a radial direction is smaller than the diameter of the opening 355*a*.

Figure 6C:
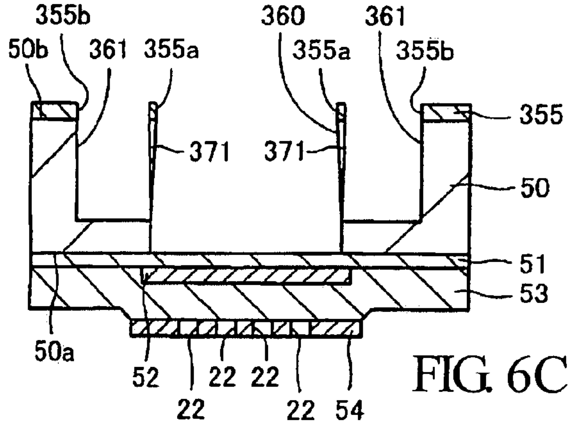
FIG. 6C is a cross-sectional view for explaining a second step of the manufacturing method of the condenser microphone.
Figure 6D:
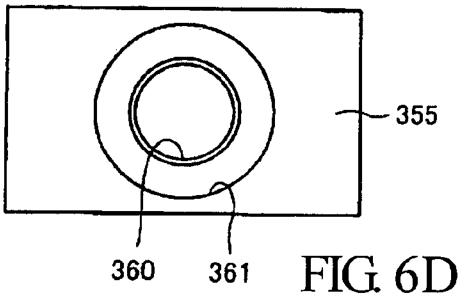
FIG. 6D is a plan view corresponding to FIG. 6C.

In a second step of the manufacturing method (i.e., (A2) and (B2) shown in FIGS. 6C and 6D), the wafer 50 is subjected to anisotropic etching using the mask 355, thus forming a hole 360 and a recess 361 in the wafer 50. Each of the hole 360 and the recess 361 is formed in a reversely tapered shape extended in a vertical direction from the second surface 50*b* to the first surface 50*a* of the wafer 50. Specifically, the prescribed portion of the wafer 50 that is exposed from the mask 355 is selectively removed by way of anisotropic etching such as Deep-RIE. The anisotropic etching is performed in such a way that the hole 360 is completely formed to positionally match the opening 355*a* of the wafer 50. By adjusting etching conditions, it is possible to form the hole 360 and the recess 361 each having a reversely tapered shape. For example, the wafer 50 is etched in a low deposition condition for side wall protection films; alternatively, the wafer 50 is etched while adjusting the formation time and etching time adapted to side wall protection films. As a result, a wall 371 formed between the hole 360 and the recess 361 is gradually reduced in thickness in the vertical direction from the second surface 50*b* to the first surface 50*a* in the wafer 50.

Figure 6E:
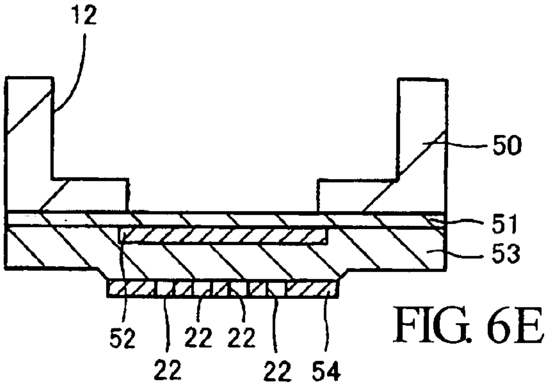
FIG. 6E is a cross-sectional view for explaining a third step of the manufacturing method of the condenser microphone.
Figure 6F:
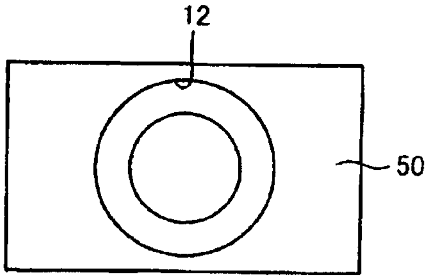
FIG. 6F is a plan view corresponding to FIG. 6E.

In a third step of the manufacturing method (i.e., (A3) and (B3) shown in FIGS. 6E and 6F), the wall 371 of the wafer 50 is removed. That is, the wafer 50 is subjected to wet etching using an etching solution such as potassium hydroxide (KOH) and tetra-methyl ammonium hydroxide (TMAH). Herein, the thin portion of the wall 371 is dissolved first compared with the other portion, so that the wall 371 is separated from the wafer 50; then, the wall 371 isolated from the wafer 50 is completely dissolved in the etching solution. As a result, it is possible to form the through-hole 12 having a step portion in the wafer 50. The process for isolating the wall 371 from the wafer 50 is not necessarily limited to the aforementioned process. For example, the wall 371 can be isolated from the wafer 50 by applying ultrasonic waves or mechanical vibration to the wall 371. Steps following the aforementioned steps are substantially identical to those of the manufacturing method of the condenser microphone 1.

(c) Third Variation

Figure 7A:
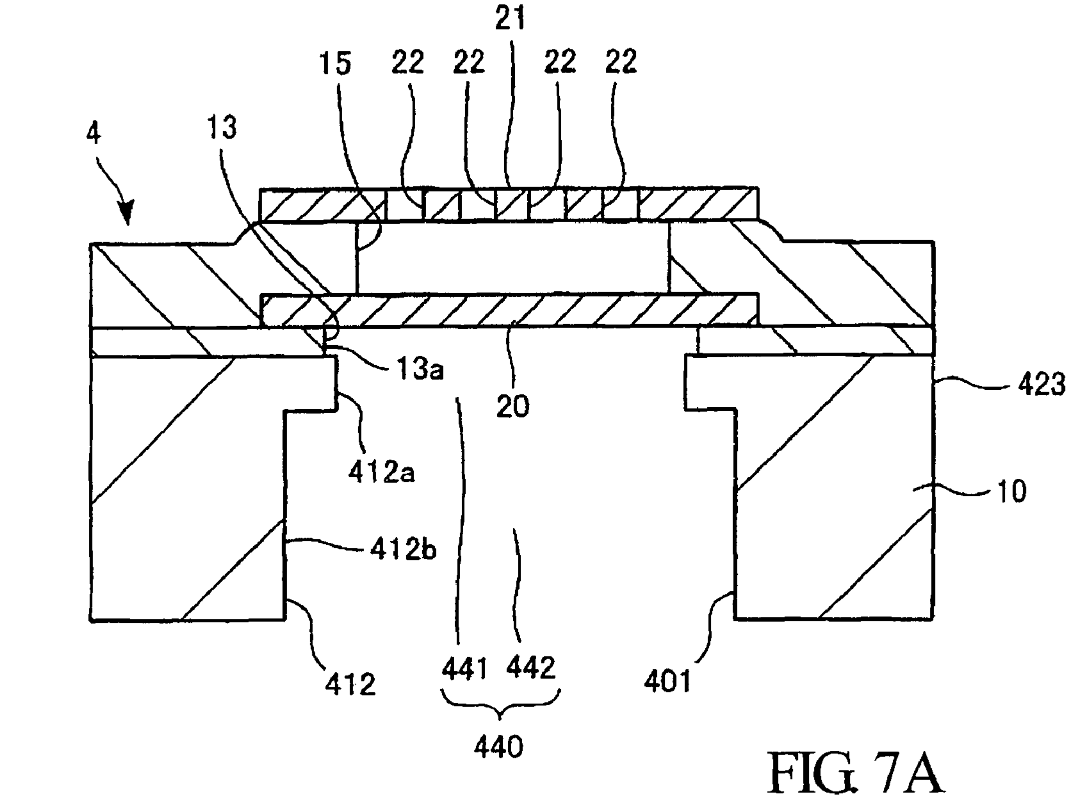
FIG. 7A is a cross-sectional view taken along line A7-A7 in FIG. 7B.
Figure 7B:
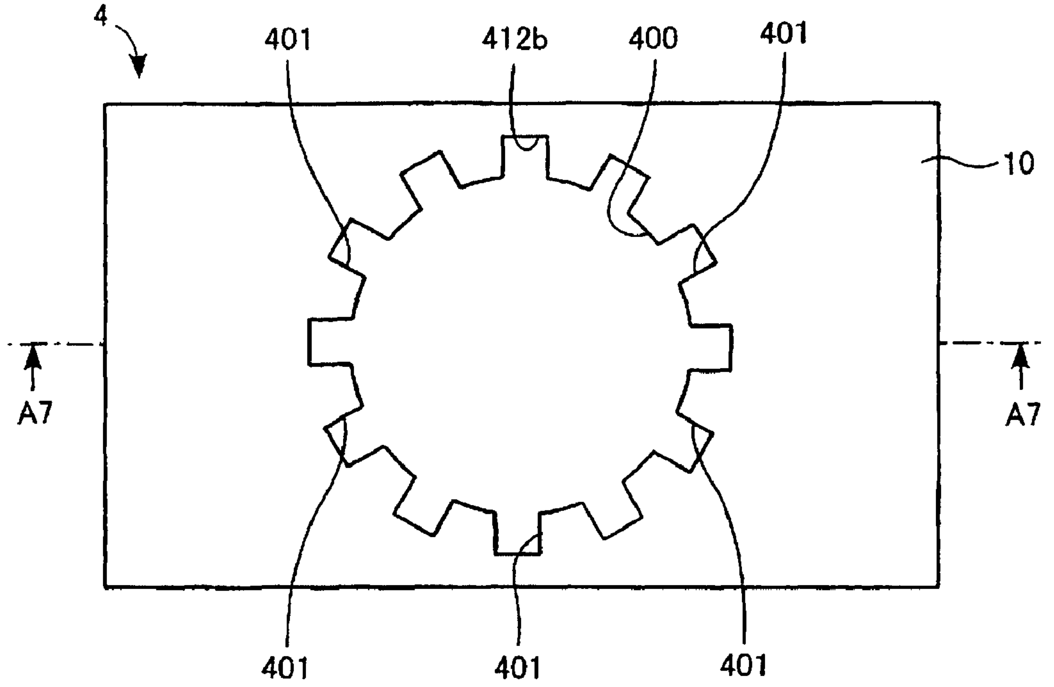
FIG. 7B is a bottom view showing the constitution of a condenser microphone in accordance with a third variation of the first embodiment.

FIGS. 7A and 7B show the constitution of a condenser microphone 4 in accordance with a third variation of the first embodiment. The sensing portion of the condenser microphone 4 differs from the sensing portion of the condenser microphone 1 in terms of the shape of the substrate 10. A through-hole 412 having a step portion is formed and runs through the substrate 10 of the condenser microphone 4 in the thickness direction, wherein it is constituted of a hole 400 having a cylindrical shape and a plurality of recesses 401, which are formed in a radial manner in the circumferential periphery of the hole 400 so as to directly communicate with the hole 400. A support 423 is constituted of the substrate 10, the first film, the third film, and the prescribed portions of the second and fourth films that are not fixed to the third film.

A back cavity 440 constituted of a first cavity 441 and a second cavity 442 is formed in the support 423. The first cavity 441 is formed inwardly of an interior wall 412*a* of the hole 400 positioned in proximity to the plate 21 and inwardly of the interior wall 13*a* of the opening 13 of the second film. The second cavity 442 is formed inwardly of an interior wall 412*b*, which is constituted of an interior wall of the hole 400 positioned in proximity to the plate 21 and interior walls of the recesses 401. In the claim language, the interior wall 412*a* of the substrate 10 and the interior wall 13*a* of the second film are both defined as a first interior wall, and the interior wall 412*b* of the substrate 10 is defined as a second interior wall.

The detecting portion of the condenser microphone 4 is substantially identical to the detecting portion of the condenser microphone 1. The operation of the condenser microphone 4 is substantially identical to the operation of the condenser microphone 1. Hence, the detailed description regarding the operation of the condenser microphone 4 will be omitted.

Figure 8A:
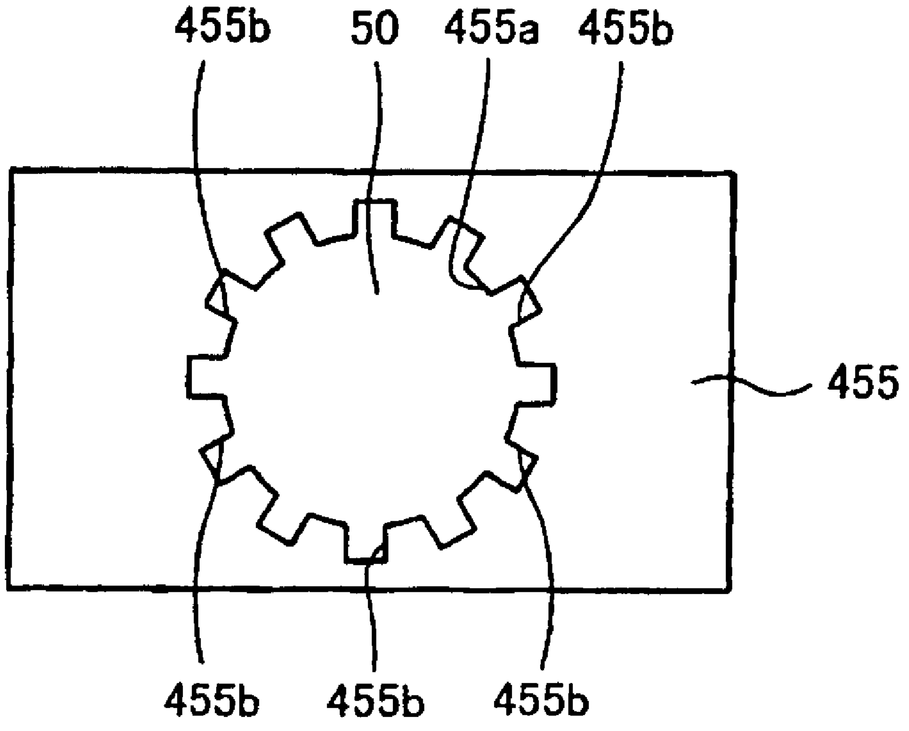
FIG. 8A is a bottom view for explaining a manufacturing method of the condenser microphone.
Figure 8B:
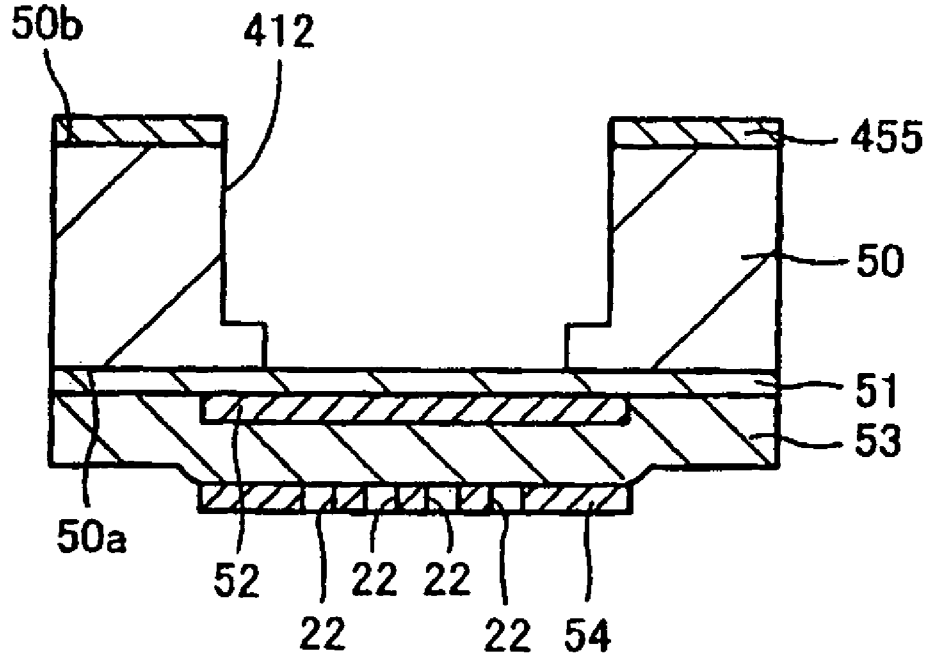
FIG. 8B is a cross-sectional view corresponding to FIG. 8A.

Next, a manufacturing method of the condenser microphone 4 will be described with reference to FIGS. 8A and 8B.

Similar to the manufacturing method of the condenser microphone 1, the first film 51, the second film 52, the third film 53, and the fourth film 54 are formed on the first surface 50*a* of the wafer 50.

Next, a mask 455 having an opening 455*a* and a plurality of openings 455*b* is formed on the second surface 50*b* of the wafer 50. That is, a photoresist film is applied entirely to the second surface 50*b* of the wafer 50; then, the mask 455 is formed by way of photolithography for performing exposure and development using a prescribed resist mask. The opening 455*a* has a circular shape that exposes the prescribed portion of the wafer 50 just above the second film 52 and the fourth film 54. The openings 455*b* form slits that are elongated from the opening 455*a* in a radial manner. Each of widths of the openings 455*b* lying in a circumferential direction of the opening 455*a* is smaller than the diameter of the opening 455*a*.

Next, the wafer 50 is subjected to wet etching using the mask 455, thus forming the through-hole 412 in the wafer 50. Specifically, the prescribed portion of the wafer 50 that is exposed from the mask 455 is selectively removed by way of anisotropic etching such as Deep-RIE. The anisotropic etching is performed in such a way that the hole 400 is completely formed to positionally match the opening 455*a* of the wafer 50 (see FIGS. 7A and 7B). Each of widths of the openings 455*b* lying in a radial direction of the opening 455*a* is smaller than the diameter of the opening 455*a*. Due to the aspect-dependent etching effect, the recesses 401 are formed to positionally match the openings 455*b* of the wafer 50. As a result, it is possible to form the through-hole 412 having a step portion, which is constituted of the hole 400 and the plural recesses 401, in the wafer 50, wherein the prescribed portion of the first film 51 just above the second film 52 and the fourth film 54 is exposed in the through-hole 412. The remaining portions of the second film 52 and the fourth film 54 are still deposited in the surrounding area of the opening in the second surface 50*b* of the wafer 50 after completion of the formation of the through-hole 412.

Steps following the aforementioned steps are substantially identical to those of the manufacturing method of the condenser microphone 1.

The first embodiment and its variations are designed such that, in view of the plane direction of the diaphragm 20, the cross-sectional area of the second cavity is rapidly increased in comparison with the cross-sectional area of the first cavity; and the end portions of the diaphragm 20 and the plate 21 are fixed to the interior wall of the first cavity. Therefore, it is possible to increase the volume of the back cavity without bearing limitation due to the sizes of the diaphragm 20 and the plate 21 and without increasing the overall size of the condenser microphone.

In the first variation (see FIGS. 4A and 4B), the cross-sectional area of the second cavity 242 in view of the plane direction of the diaphragm 20 is enlarged in a step-like manner in the direction opposite to the plate 21. Since the cross-sectional area of the second cavity 242 in view of the plane direction of the diaphragm 20 is discontinuously enlarged in the direction opposite to the plate 21, it is possible to increase the volume of the back cavity 240.

(d) Other Variations

The first embodiment and its variations are each directed to the condenser microphone, which is an example of a pressure sensor. Of course, the first embodiment can be applied to other types of pressure sensors that detect various kinds of pressure other than sound pressure.

The first embodiment and its variations are each directed to the condenser microphone in which both of the diaphragm 20 and the plate 21 have circular shapes whose circumferential peripheries are entirely fixed to the support. The sensing portion of the condenser microphone constituted of the diaphragm and plate is not necessarily limited to the aforementioned structure. For example, the end portions of the diaphragm and plate can be partially fixed to the support. Specifically, both ends of the diaphragm can be fixed to the support; alternatively, the diaphragm can be fixed to the support in a cantilever manner. The shapes of the diaphragm and plate are not necessarily limited to circular shapes. Specifically, the diaphragm and plate can be formed in polygonal shapes. The plate can be positioned close to the back cavity rather than the diaphragm. The diaphragm is not necessarily directly fixed to the support. Specifically, the diaphragm can be attached to the plate in a hung-down manner; alternatively, the diaphragm can be supported by the plate.

The first embodiment and its variations are each designed such that a through-hole having a step portion realizing a rectangular step portion is formed in the substrate 10, although it is not necessary to form the rectangular step portion along the interior wall of the support.

In the first embodiment, first variation, and second variation, the second cavity is formed and is enlarged in the periphery of the first cavity, whereby it is possible to enlarge the second cavity partially externally of the first cavity.

The manufacturing method of the condenser microphone 1 can be applied to the manufacturing of the condenser microphone 2. In this case, it is necessary to form a multilayered mask in which the number of layers depends upon the number of the step portions formed in the through-hole 12. A multilayered mask constituted of the first mask 55 and the second mask 56 (see FIGS. 3A, 3C, and 3E) is used in the manufacturing method of the condenser microphone 1, although it is possible to use a single-layered resist mask whose thickness depends upon the overall shape of the through-hole 12 having a step portion.

The manufacturing method of the condenser microphone 2 can be applied to the manufacturing of the condenser microphone 1. In this case, it is necessary to form the openings 255*b*, 255*c*, and 255*d*, all of which have the same width in the radial direction, in the mask 255.

The manufacturing method of the condenser microphone 2 uses the mask 255 having the ring-shaped openings 255*b*, 255*c*, and 255*d*, although it is possible to form the openings 255*b*, 255*c*, and 255*d* each in a band-like shape.

The manufacturing method of the condenser microphone 2 can be modified such that other slit-like openings, which cross the openings 255*b*, 255*c*, and 255*d*, can be additionally formed in the mask 255. In this case, the walls of the recesses corresponding to the openings 255*a*, 255*b*, and 255*c* are split by means of the recesses corresponding to the other openings in the substrate 10. This makes it easy to remove the walls by way of wet etching.

The second variation describes the manufacturing method of the condenser microphone 1. Of course, the second variation can be applied to the manufacturing of the condenser microphone 2.

In the third variation, the plurality of recesses 401 are formed to communicate with the hole 400, although it is possible to form a single recess 401 in the periphery of the hole 400.

In the third variation, the plurality of recesses 401 are evenly distributed in a radial manner externally of the hole 400; alternatively, it is possible to unevenly distribute the recesses 401 in the periphery of the hole 400.

2. Second Embodiment

Figure 9:
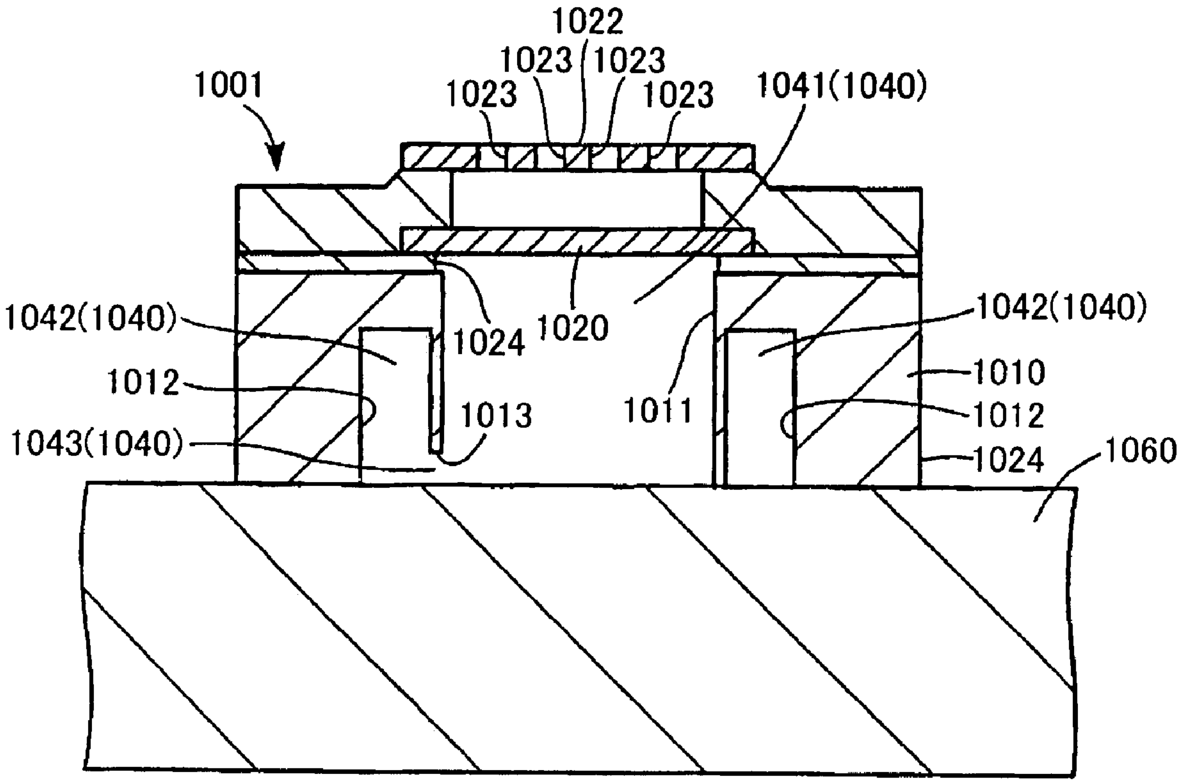
FIG. 9 is a cross-sectional view showing the constitution of a condenser microphone mounted on a printed board in accordance with a second embodiment of the present invention.
Figure 10A:
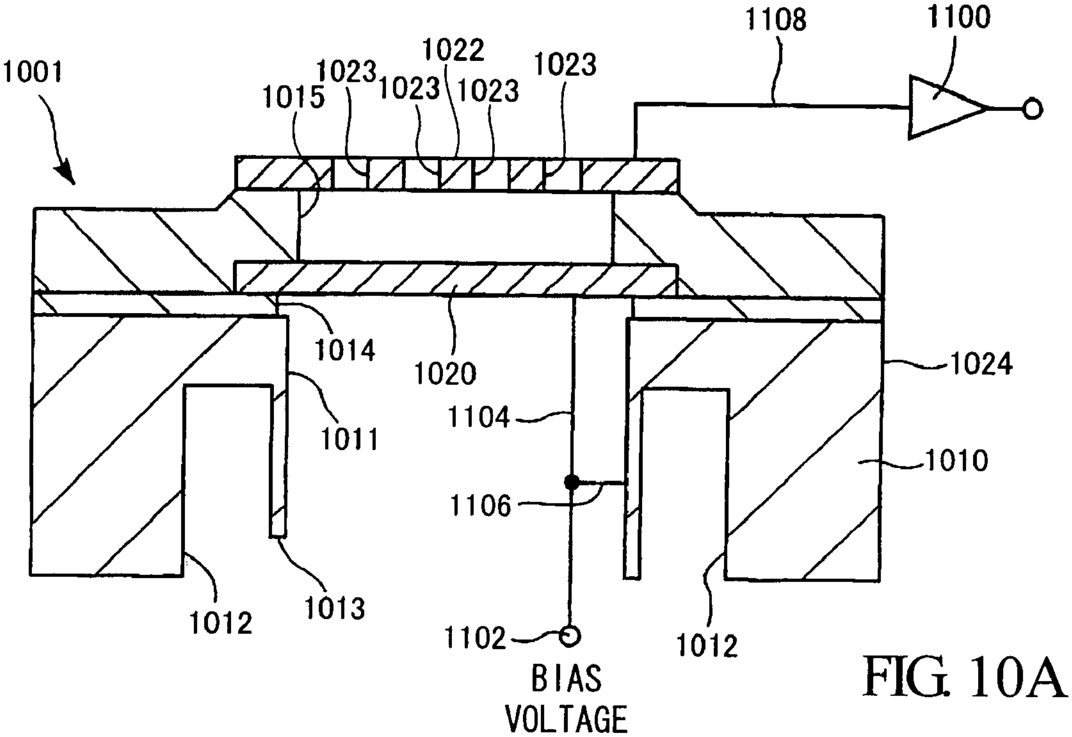
FIG. 10A is a cross-sectional view taken along line A2-A2 in FIG. 10B.
Figure 10B:
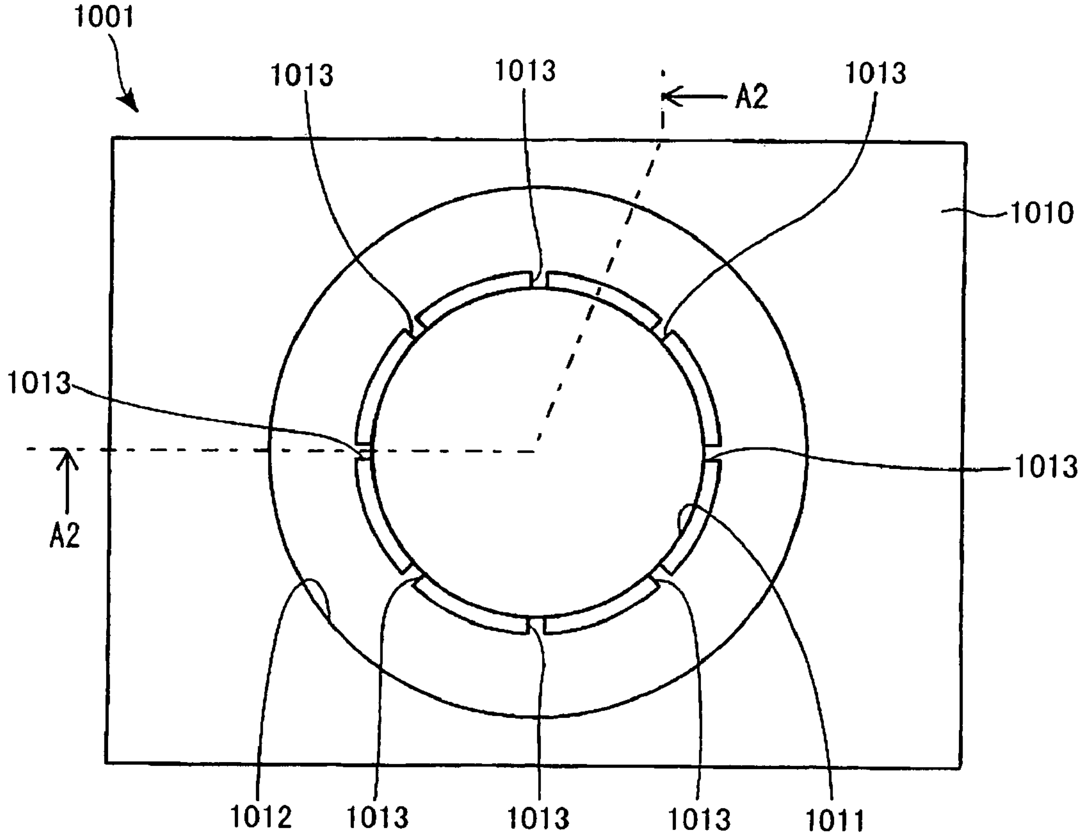
FIG. 10B is a bottom view of the condenser microphone.

FIG. 9 and FIGS. 10A and 10B show the constitution of a condenser microphone 1001 in accordance with a second embodiment of the present invention. The condenser microphone 1001 is a silicon capacitor microphone that is manufactured by way of semiconductor device manufacturing processes, wherein it converts sound waves transmitted thereto via a plate 1022 into electric signals.

A sensing portion of the condenser microphone 1001 has a laminated structure constituted of a substrate 1010, a first film, a second film, a third film, and a fourth film.

The substrate 1010 is a monocrystal silicon substrate, in which a hole 1011, a recess 1012, and a plurality of recesses 1013 are formed in the thickness direction. The recess 1012 has a ring shape surrounding the hole 1011. Each of the recesses 1013 has a linear shape elongated from the hole 1011 to the recess 1012 in a radial direction of the hole 1011.

The first film is an insulating thin film composed of silicon dioxide. The first film supports the second film above the substrate 1010 in such a way that a gap is formed between a diaphragm 1020 and the substrate 1010. An opening 1014 having a circular shape is formed in the first film.

The second film is a conductive thin film composed of polysilicon doped with phosphorus (P) impurities. The prescribed portion of the second film that is not fixed to the third film forms the diaphragm 1020. The diaphragm 1020 is not fixed to either the first film or the third film; hence, it serves as a moving electrode vibrating due to sound waves. The diaphragm 1020 has a circular shape covering the opening 1014 of the first film.

Similar to the first film, the third film is an insulating thin film composed of silicon dioxide. The third film insulates the second film (having conductivity) from the fourth film so as to support the fourth film above the second film. The third film has an opening 1015 having a circular shape.

Similar to the second film, the fourth film is a conductive thin film composed of polysilicon doped with phosphorus impurities. The prescribed portion of the fourth film that is not fixed to the third film forms the plate 1022, which has a plurality of holes 1023.

A support 1024 is constituted of the substrate 1010, the first film, the third film, and the prescribed portions of the second and fourth films that are not fixed to the third film. As shown in FIG. 9, the support 1024 forms a back cavity 1040 constituted of a first cavity (or a main cavity) 1041 and a second cavity (or a sub cavity) 1042, which communicates with the first cavity 1041 via a passage 1043. The back cavity 1040 releases pressure that is applied to the diaphragm 1020 in a direction opposite to a propagation direction of sound waves. The first cavity 1041 is formed inwardly of the diaphragm 1020, the opening 1014 of the second film, the hole 1011 of the substrate 1010, and a printed board 1060 on which the condenser microphone 1001 is mounted. The second cavity 1042 is formed inwardly of the recess 1012 of the substrate 1010 and the printed board 1060. In the claim language, the recesses 1012 and 1013 of the substrate 1010 are both defined as a sub-cavity forming portion, and the hole 1011 and the recesses 1012 and 1013 of the substrate 1010 are all defined as a cavity forming portion.

Next, a detecting portion of the condenser microphone 1001 will be described with reference to the circuitry shown in FIG. 10A. The diaphragm 1020 is connected to a bias voltage source. Specifically, leads 1104 and 1106 connected to a terminal 1102 of the bias voltage source are connected to the second film and the substrate 1010 respectively, whereby both of the diaphragm 1020 and the substrate 1010 are placed at substantially the same potential. The plate 1022 is connected to an input terminal of an operation amplifier 1100. That is, a lead 1108 connected to the input terminal of the operational amplifier 1100 having relatively high input impedance is connected to the fourth film.

Next, the operation of the condenser microphone 1001 will be described in detail. When sound waves are transmitted through the holes 1023 of the plate 1022 so as to reach the diaphragm 1020, the diaphragm 1020 vibrates due to sound waves. Due to the vibration of the diaphragm 1020, the distance between the diaphragm 1020 and the plate 1022 varies so that electrostatic capacitance therebetween varies correspondingly.

Since the plate 1022 is connected to the operational amplifier 1100 having relatively high input impedance, a very small amount of electric charge existing in the plate 1022 moves toward the operational amplifier 1100 even when electrostatic capacitance between the diaphragm 1020 and the plate 1022 varies. That is, it is presumed that substantially no variations occur in electric charges existing in the plate 1022 and the diaphragm 1020. This makes it possible to translate variations of electrostatic capacitance between the diaphragm 1020 and the plate 1022 into potential variations of the plate 1022. As a result, the condenser microphone 1001 is capable of producing electric signals based on very small variations of electrostatic capacitance between the diaphragm 1020 and the plate 1022. In the condenser microphone 1001, variations of sound pressure applied to the diaphragm 1020 are converted into variations of electrostatic capacitance, which are then converted into potential variations, based on which electric signals are produced in response to variations of sound pressure.

The internal pressure (or back pressure) of the back cavity 1040 varies due to the vibration of the diaphragm 1020. That is, the volume of the back cavity 1040 greatly affects the vibration of the diaphragm and thus affects output characteristics of the condenser microphone 1001. Specifically, it is possible to improve low-frequency characteristics of the condenser microphone 1001 by increasing the volume of the back cavity 1040, while it is possible to improve high-frequency characteristics of the condenser microphone 1001 by decreasing the volume of the back cavity 1040.

The resistance of the passage 1043 allowing the first cavity 1041 to communicate with the second cavity 1042 in the back cavity 1040 increases in response to the flow velocity of air flowing through the passage 1043. As the frequency of variations of back pressure increases, in other words, as the frequency of the displacement of the diaphragm 1020 increases due to sound waves having high frequencies, substantially no air flows between the first cavity 1041 and the second cavity 1042. This indicates that the volume of the back cavity 1040 can be substantially regarded as the volume of the first cavity 1041. In contrast, as the frequency of variations of back pressure decreases, in other words, as the frequency of the displacement of the diaphragm 1020 decreases due to sound waves having low frequencies, air adequately flows between the first cavity 1041 and the second cavity 1042. This indicates that the volume of the back cavity 1040 can be substantially regarded as the sum of the volumes of the first cavity 1041 and the second cavity 1042.

Since the volume of the back cavity 1040 substantially varies in response to the frequency of sound waves, it is possible to improve both of low-frequency characteristics and high-frequency characteristics in the condenser microphone 1001. That is, output characteristics of the condenser microphone 1001 can be adjusted by appropriately setting the volume of the first cavity 1041, the volume of the second cavity 1042, and the resistance of the passage 1043. The resistance of the passage 1043 can be set by appropriately setting the length, width, and depth of the recess 1013 formed in the substrate 1010. The depth of the recess 1013 is not necessarily smaller than the depth of the recess 1012 in the thickness direction of the substrate 1010. As shown in FIGS. 10A and 10B, the length of the recess 1013 is measured in a radial direction of the hole 1011; the width of the recess 1013 is measured in a circumferential direction of the hole 1011; and the depth of the recess 1013 is measured in the thickness direction of the substrate 1010.

Next, a manufacturing method of the condenser microphone 1001 will be described with reference to FIGS. 11A to 11F and FIGS. 12A to 12D.

Figure 11A:
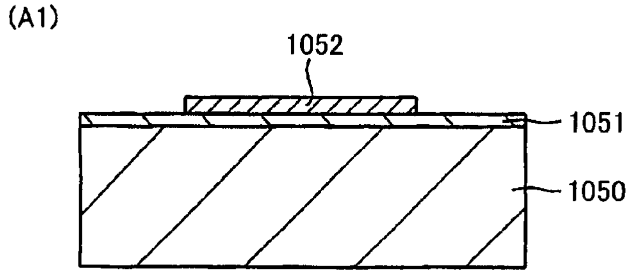
FIG. 11A is a cross-sectional view for explaining a first step of a manufacturing method of the condenser microphone.
Figure 11B:
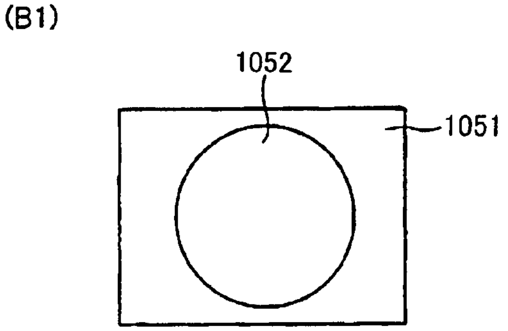
FIG. 11B is a plan view corresponding to FIG. 11A.

In a first step of the manufacturing method (i.e., (A1) and (B1) shown in FIGS. 11A and 11B), a first film 1051 is deposited on a wafer 1050, which serves as the substrate 1010 (see FIGS. 10A and 10B). Specifically, silicon dioxide is deposited on the monocrystal silicon wafer 1050 by way of plasma CVD, thus forming the first film 1051.

Next, a second film 1052 is deposited on the first film 1051. That is, phosphorus-doped polysilicon is deposited on the first film 1051 by way of decompression CVD, thus forming the second film 1052. Next, a photoresist film is applied to the entire surface of the second film 1052; then, a resist pattern is formed by way of photolithography for performing exposure and development using a prescribed resist mask. Then, the second film 1052 is selectively removed by way of anisotropic etching such as RIE (i.e., Reactive Ion Etching), thus shaping the second film 1052 in a circular shape.

Figure 11C:
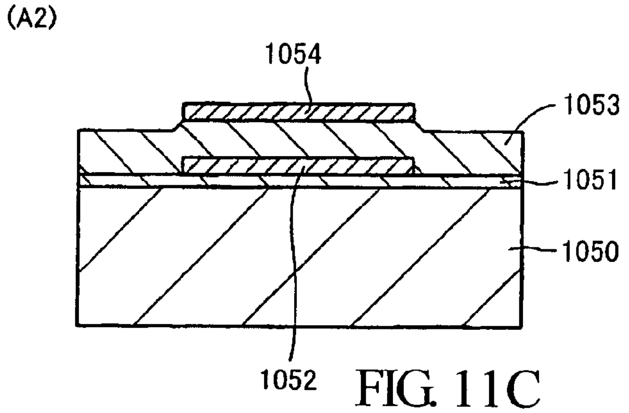
FIG. 11C is a cross-sectional view for explaining a second step of the manufacturing method of the condenser microphone.
Figure 11D:
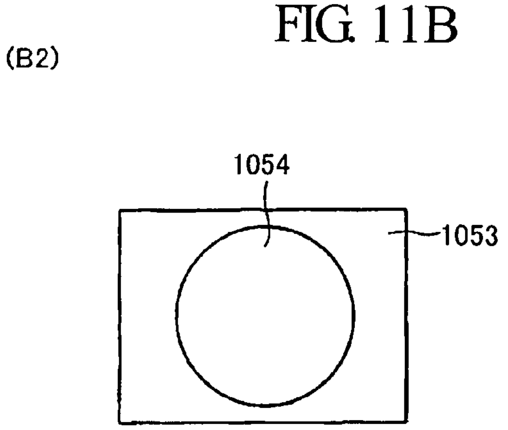
FIG. 11D is a plan view corresponding to FIG. 11C.

In a second step of the manufacturing method (i.e., (A2) and (B2) shown in FIGS. 11C and 11D), a third film 1053 is deposited on the second film 1052. Specifically, silicon dioxide is deposited on the second film 1052 by way of plasma CVD, thus forming the third film 1053.

Figure 11E:
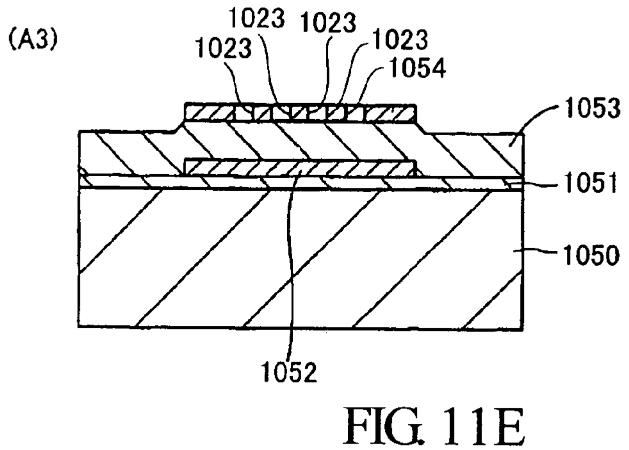
FIG. 11E is a cross-sectional view for explaining a third step of the manufacturing method of the condenser microphone.
Figure 11F:
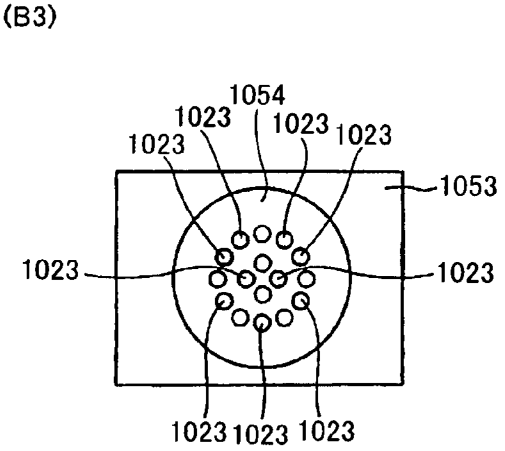
FIG. 11F is a plan view corresponding to FIG. 11E.

In a third step of the manufacturing method (i.e., (A3) and (B3) shown in FIGS. 11E and 11F), a fourth film 1054 is deposited on the third film 1053. Specifically, phosphorus-doped polysilicon is deposited on the third film 1053 by way of decompression CVD, thus forming the fourth film 1054. Next, a photoresist film is applied to the entire surface of the fourth film 1054; then, a resist pattern is formed by way of photolithography for performing exposure and development using a prescribed resist mask. Then, the fourth film 1054 is selectively removed by way of anisotropic etching such as RIE, thus shaping the fourth film 1054 having a circular shape and a plurality of holes 1023.

Figure 12A:
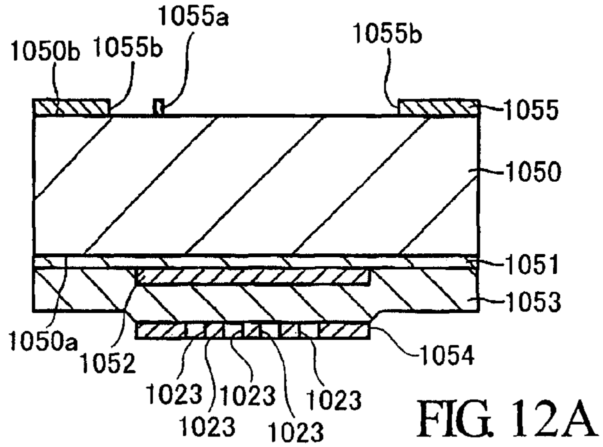
FIG. 12A is a cross-sectional view for explaining a fourth step of the manufacturing method of the condenser microphone.
Figure 12B:
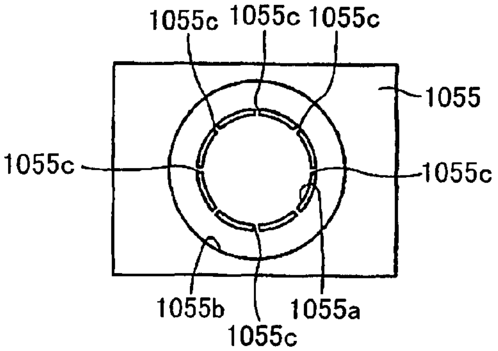
FIG. 12B is a plan view corresponding to FIG. 12A.

In a fourth step of the manufacturing method (i.e., (A4) and (B4) shown in FIGS. 12A and 12B), a mask 1055 having a first opening 1055*a*, a second opening 1055*b*, and a plurality of third openings 1055*c* is formed on a second surface 1050*b* opposite to a first surface 1050*a* of the wafer 1050 on which the first film 1051, the second film 1052, the third film 1053, and the fourth film 1054 are laminated. That is, a photoresist mask is applied to the entire surface of the second surface 1050*b* of the wafer 1050; then, the mask 1055 is formed by way of photolithography for performing exposure and development using a prescribed resist mask. The first opening 1055*a* has a circular shape exposing the prescribed portion of the wafer 1050 just above the second film 1052 and the fourth film 1054. The second opening 1055*b* has a ring-shaped slit surrounding the periphery of the first opening 1055*a*. Each of the third openings 1055*c* is a slit whose width is smaller than the width of the slit-shaped second opening 1055*b*. The third openings 1055*c* are elongated in a radial manner in a direction from the first opening 1055*a* to the second opening 1055*b*. For example, the width of the second opening 1055*b* ranges from 1 μm to 100 μm (preferably, from 1 μm to 70 μm); and the width of the third opening 1055*c* ranges from 1 μm to 50 μm (preferably, from 1 μm to 40 μm). In the condenser microphone 1001 shown in FIGS. 10A and 10B, the width of the second opening 1055*b* is measured in the radial direction of the first opening 1055*a*; and the width of the third opening 1055*c* is measured in the circumferential direction of the first opening 1055*a*.

Figure 12C:
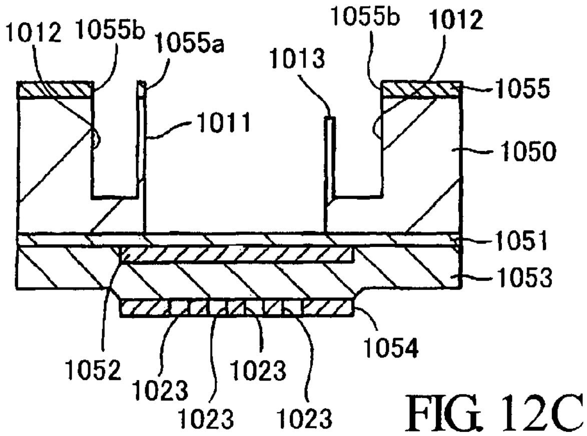
FIG. 12C is a cross-sectional view for explaining a fifth step of the manufacturing method of the condenser microphone.
Figure 12D:
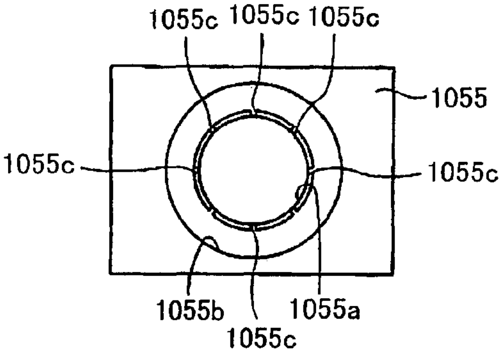
FIG. 12D is a plan view corresponding to FIG. 12C.

In a fifth step of the manufacturing method (i.e., (A5) and (B5) shown in FIGS. 12C and 12D), anisotropic etching is performed using the mask 1055 on the wafer 1050 so as to form the hole 1011 and the recesses 1012 and 1013 in the wafer 1050. Specifically, the prescribed portion of the wafer 1050 exposed from the mask 1055 is selectively removed by way of anisotropic etching such as Deep-RIE. Herein, the width of the second opening 1055*b* and the width of the third opening 1055*c* are both smaller than the diameter of the first opening 1055*a*; and the width of the third opening 1055*c* is smaller than the width of the second opening 1055*b*. Due to the aspect-dependent etching effect, the etching speed applied to the second opening 1055*b* and the third openings 1055*c* of the wafer 1050 becomes slower than the etching speed applied to the first opening 1055*a*. In addition, the etching speed applied to the third openings 1055*c* becomes slower than the etching speed applied to the first opening 1055*a*. Furthermore, the etching speed applied to the third openings 1055*c* becomes slower than the etching speed applied to the second opening 1055*b*. As a result, the recess 1012 is formed in conformity with the second opening 1055*b* of the wafer 1050. In addition, the recess 1013 whose depth is smaller than the depth of the recess 1012 is formed in conformity with the third openings 1055*c* of the wafer 1050.

Next, the mask 1055 is removed by use of a resist peeling solution such as NMP (i.e., N-methyl-2-pyrolidone).

Next, the first film 1051 and the third film 1053, both of which are silicon oxide films, are selectively removed by way of isotropic wet etching using an etching solution such as buffered hydrofluoric acid or by way of the combination of isotropic etching and anisotropic etching. At this time, the etching solution is supplied via the holes 1023 of the fourth film 1054 and the hole 1011 of the wafer 1050, thus dissolving the first film 1051 and the third film 1053. The openings 1014 and 1015 are formed in the first film 1051 and the third film 1053 by appropriately designing the shapes and arrangements of the holes 1023 and the hole 1011, thus forming the diaphragm 1020, the plate 1022, and the support 1024 forming the sensing portion of the condenser microphone 1001 (see FIG. 9).

Thereafter, the condenser microphone 1001 is completely produced by way of dicing and packaging steps.

(a) First Variation

The manufacturing method of the condenser microphone 1001 can be modified in a variety of ways. A first variation of the manufacturing method will be described with reference to FIGS. 13A to 13D.

Similar to the aforementioned manufacturing method, the first film 1051, the second film 1052, the third film 1053, and the fourth film 1054 are deposited on the first surface 1050*a* of the wafer 1050.

Figure 13A:
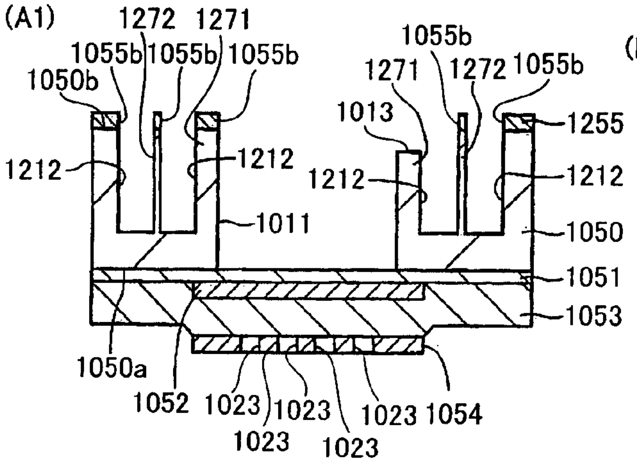
FIG. 13A is a cross-sectional view for explaining a first step of a manufacturing method of a condenser microphone according to a variation of the second embodiment.
Figure 13B:
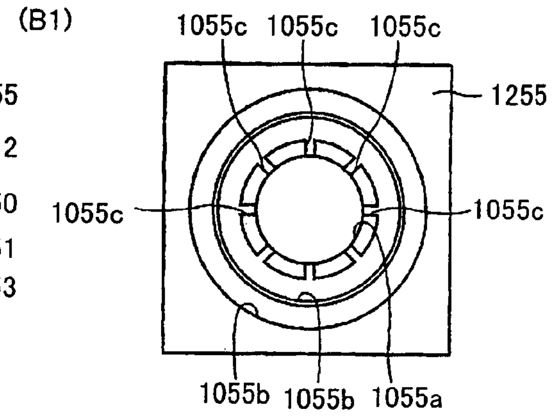
FIG. 13B is a plan view corresponding to FIG. 13A.

In a first step of the manufacturing method (i.e., (A1) and (B1) shown in FIGS. 13A and 13B), a mask 1255 is formed on the second surface 1050*b* of the wafer 1050. A plurality of second openings 1055*b* are formed in the periphery of the first opening 1055*a* in the mask 1255. The distance between the adjacent second openings 1055*b* is smaller than the distance between the first opening 1055*a* and the second opening 1055*b*. Specifically, the distance between the first opening 1055*a* and the second opening 1055*b* is greater than 20 μm, and the distance between the adjacent second openings 1055*b* is less than 20 μm.

Next, similar to the aforementioned manufacturing method, anisotropic etching is performed using the mask 1255 on the wafer 1050, thus forming the hole 1011 and a plurality of recesses 1212 sequentially surrounding the hole 1011 in the wafer 1050. A wall 1272 between the adjacent recesses 1212 is thinner than a wall 1271 between the hole 1011 and the recess 1212.

Figure 13C:
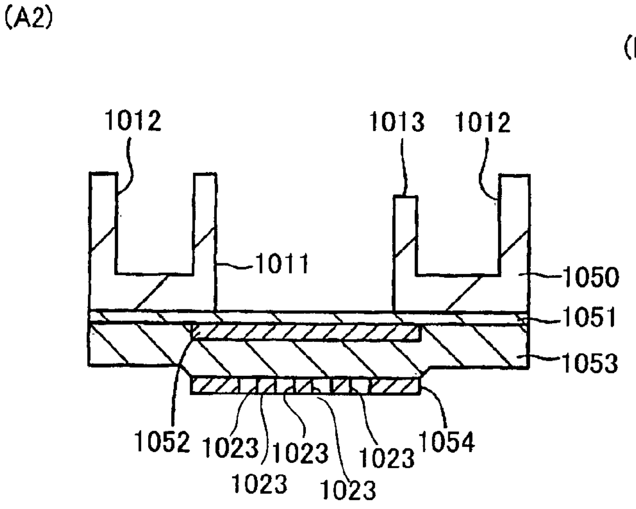
FIG. 13C is a cross-sectional view for explaining a second step of the manufacturing method of the condenser microphone.
Figure 13D:
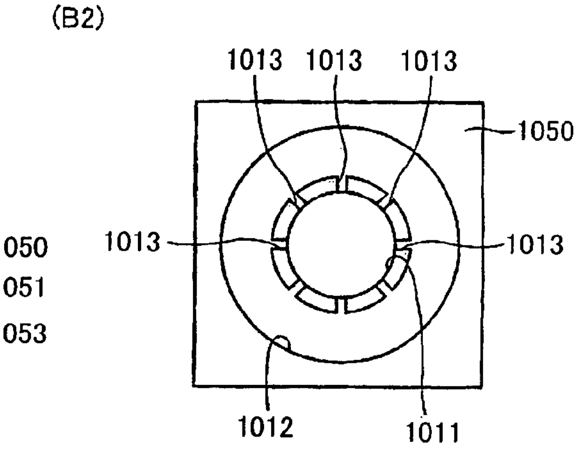
FIG. 13D is a plan view corresponding to FIG. 13C.

In a second step of the manufacturing method (i.e., (A2) and (B2) shown in FIGS. 13C and 13D), the wall 1272 between the adjacent recesses 1212 is removed so as to form the recess 1012 forming the second cavity 1042 (see FIG. 9 and FIG. 10A) in the wafer 1050. Specifically, the second surface 1050*b* of the monocrystal silicon wafer 1050 is subjected to thermal oxidation so as to transform the wall 1272 into silicon oxide. Next, wet etching is performed using an etching solution such as buffered hydrofluoric acid so as to selectively remove the wall 1272.

Steps following the aforementioned steps are substantially identical to steps of the aforementioned manufacturing method. In the first variation of the manufacturing method, a plurality of recesses 1212 are formed in the wafer 1050 in such a way that the wall 1272 becomes thinner than the wall 1271. Herein, the recesses 1212 can be further modified in arrangement as long as the wall 1272 between the adjacent recesses 1212 can be selectively removed relative to the wall 1271.

(b) Second Variation

The overall constitution of a condenser microphone according to a second variation of the second embodiment is substantially identical to the overall constitution of the condenser microphone 1001 except for the shaping of a support 1024. The support 1024 forms a back cavity constituted of the first cavity 1041 and a plurality of second cavities 1042 communicating with the first cavity 1041. Herein, the second cavities 1042 communicate with the first cavity 1041 via a plurality of passages 1043 having different resistances. This condenser microphone is produced in such a way that the hole 1011, the plurality of recesses 1012 each having a circular arc shape, and the recess 1013 extended from the hole 1011 to the recesses 1012 are formed in the second surface 1050*b* of the wafer 1050.

It is possible to delicately adjust output characteristics of the condenser microphone by individually setting resistances of the passages 1043 in response to required output characteristics. All of the second cavities 1042 have the same volume, or they have different volumes. It is possible to delicately adjust output characteristics of the condenser microphone by individually setting the volumes of the second cavities.

(c) Other Variations

The second embodiment and its variations are each directed to the condenser microphone serving as the pressure sensor, although the second embodiment is applicable to other types of pressure sensors that detect pressure variations other than variations of sound pressure.

The second embodiment and its variations are each directed to the condenser microphone in which the overall circumferences of the diaphragm 1020 and the plate 1022, each having a circular shape, are fixed to the support, although the second embodiment is not necessarily limited in terms of the constitution of the sensing portion of the condenser microphone constituted of the diaphragm and plate. For example, one end of the diaphragm and one end of the plate can be fixed to the support. In addition, both ends of the diaphragm can be fixed to the support; alternatively, the diaphragm can be fixed to the support in a cantilever manner. The diaphragm and plate are not necessarily limited in shape such as the circular shape. That is, the diaphragm and plate can be each shaped in a polygonal shape. Furthermore, the plate can be positioned in proximity to the back cavity rather than the diaphragm. The diaphragm is not necessarily directly fixed to the support. That is, the diaphragm can be attached to the plate in a hung-down manner; or the diaphragm can be supported by the plate.

In the second embodiment and its variations, the second cavity forming portion is constituted of the recesses 1012 and 1013 formed on the second surface of the substrate 1010. The second cavity forming portion can be formed using parts other than the support 1024. For example, the second cavity is arranged as a part of a package of the condenser microphone, wherein the second cavity and the first cavity communicate with each other via a passage formed in the substrate 1010.

In the second embodiment, the first cavity 1041 has a cylindrical shape. Of course, the first cavity 1041 is not necessarily formed in the cylindrical shape. The second cavity 1042 has a ring shape, although the second cavity 1042 can be redesigned to have a C-shape or a cylindrical shape. The passage 1043 is not necessarily limited to a linear shape and can be bent appropriately.

In the second embodiment, the first cavity 1041 and the second cavities 1042 communicate with each other via a plurality of passages 1043, although they can communicate with each other via a single passage.

In the second embodiment, the first cavity 1041 and the second cavities 1042 communicate with each other via the passages 1043 having different resistances, although they can communicate with each other via the passages 1043 having the same resistance. Compared with the technology in which the back cavity is constituted of a first cavity and a second cavity, the second embodiment has an advantage in terms of the degree of freedom regarding the arrangement of second cavities.

3. Third Embodiment

Figure 14A:
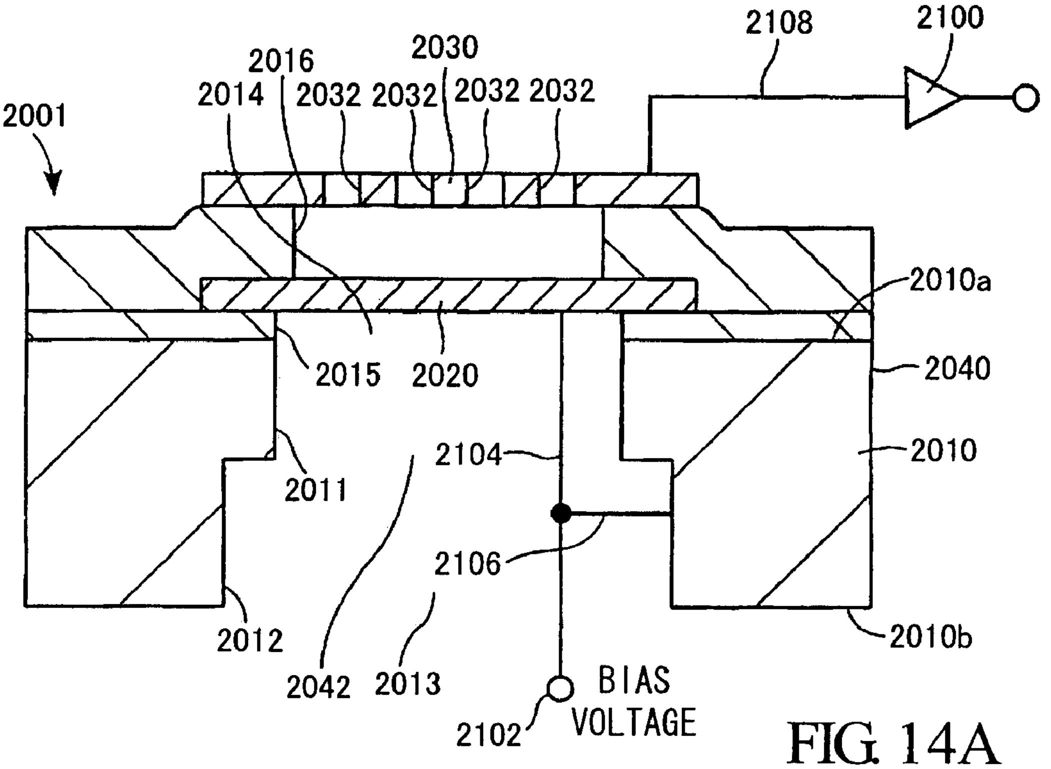
FIG. 14A is a cross-sectional view taken along line A1-A1 in FIG. 14B, which shows the constitution of a condenser microphone in accordance with a third embodiment of the present invention.
Figure 14B:
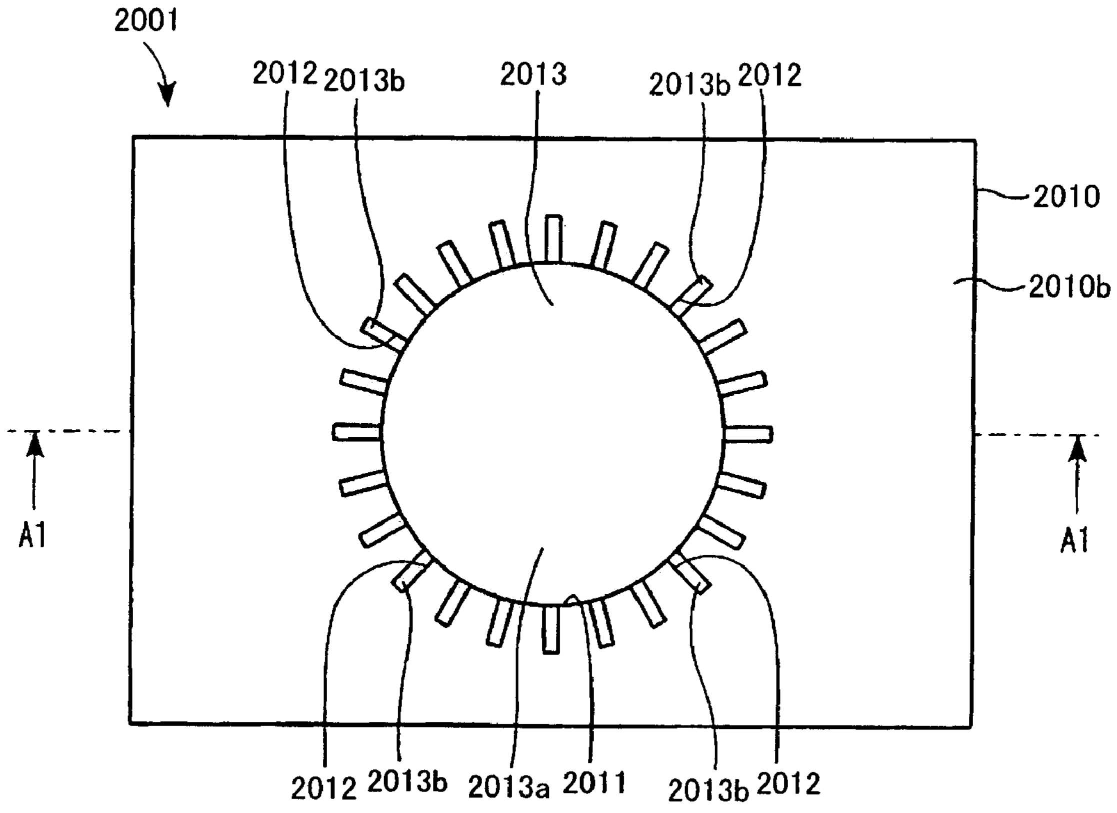
FIG. 14B is a bottom view of the condenser microphone.

FIGS. 14A and 14B show the constitution of a condenser microphone 2001 in accordance with a third embodiment of the present invention. The condenser microphone 2001 is a silicon capacitor microphone that is produced by way of semiconductor device manufacturing processes. The condenser microphone 2001 converts sound waves transmitted to a plate 2030 into electric signals.

A sensing portion of the condenser microphone 2001 has a laminated structure in which first, second, third, and fourth films are laminated together with a substrate 2010.

The substrate 2010 is a monocrystal silicon substrate. A through-hole 2011 and a plurality of recesses 2012 are formed in the substrate 2010 in its thickness direction. The through-hole 2011 is a cylindrical shape, which is opened at a first surface 2010*a* and a second surface 2010*b* of the substrate 2010. Each of the recesses 2012 has a channel-like shape elongated externally of the through-hole 2011 in its radial direction. The recesses 2012 are each opened on the second surface 2010*b* of the substrate 2010. As a result, a gear-like opening 2013, which is constituted of an opening 2013*a* corresponding to the through-hole 2011 and a plurality of openings 2013*b* corresponding to the recesses 2012, is formed in the second surface 2010*b* of the substrate 2010. The opening 2013*a* (serving as a second opening) has a circular shape. Each of the openings 2013*b* (serving as a third opening) has a rectangular shape elongated externally from the periphery of the opening 2013*a* in its radial direction. An opening 2014 corresponding to the through-hole 2011 is formed in the first surface 2010*a* of the substrate 2010. The opening 2014 (serving as a first opening) has a circular shape substantially matching the circular shape of the opening 2013*a*.

The first film is an insulating thin film composed of silicon dioxide, wherein it has a through-hole 2015 having a cylindrical shape. The first film supports the second film above the substrate 2010 in such a way that a gap is formed between a diaphragm 2020 and the substrate 2010.

The second film is a conductive thin film composed of polysilicon doped with phosphorus (P) impurities. The prescribed portion of the second film that is not fixed to the third film forms the diaphragm 2020. The diaphragm 2020 is not fixed to either the first film or the third film, wherein it serves as a moving electrode vibrating due to sound waves. The diaphragm 2020 covers the through-hole 2015 of the first film. The two-dimensional shape of the diaphragm 2020 is a circular shape.

Similar to the first film, the third film is an insulating thin film composed of silicon dioxide, wherein it has a through-hole 2016 having a cylindrical shape. The third film insulates the conductive second film from the fourth film, and it supports the fourth film above the second film.

Similar to the second film, the fourth film is a conductive thin film composed of polysilicon doped with phosphorus (P) impurities. The prescribed portion of the fourth film that is not fixed to the third film forms a plate 2030. The plate 2030 has a plurality of holes 2032.

A support 2040 is constituted of the substrate 2010, the first film, the third film, and the prescribed portions of the second and fourth films that are not fixed to the third film. The support 2040 forms a back cavity 2042 inwardly of the interior wall of the through-hole 2011 and the interior wall of the through-hole 2015. The back cavity 2042 releases pressure applied to the diaphragm 2020 in a direction opposite to the propagation direction of sound waves. In the claim language, the support 2040 except for the substrate 2010 is defined as a support.

A detecting portion of the condenser microphone 2001 will be described with reference to the circuitry shown in FIG. 14A. Herein, the diaphragm 2020 is connected to a bias voltage source. Specifically, leads 2104 and 2106 connected to a terminal 2102 of the bias voltage source are connected to the second film and the substrate 2010 respectively, whereby both of the diaphragm 2020 and the substrate 2010 are placed at substantially the same potential. The plate 2030 is connected to an input terminal of the operational amplifier 2100. That is, a lead 2108 connected to the input terminal of the operational amplifier 2100 having relatively high input impedance is connected to the fourth film.

Next, the operation of the condenser microphone 2001 will be described in detail. When sound waves are transmitted through the holes 2032 of the plate 2030 to reach the diaphragm 2020, the diaphragm 2020 vibrates due to sound waves. Due to the vibration of the diaphragm 2020, the distance between the diaphragm 2020 and the plate 2030 is varied, so that electrostatic capacitance between the diaphragm 2020 and the plate 2030 is correspondingly varied.

Since the plate 2030 is connected to the operational amplifier 2100 having relatively high input impedance, a very small amount of electric charge existing in the plate 2030 moves toward the operational amplifier 2100 irrespective of variations of electrostatic capacitance between the diaphragm 2020 and the plate 2030. That is, it is presumed that electric charges existing in the plate 2030 and the diaphragm 2020 may be substantially unchanged. This makes it possible to translate electrostatic capacitance between the diaphragm 2020 and the plate 2030 into potential variations of the plate 2030. Thus, the condenser microphone 2001 is capable of producing electric signals in response to very small variations of electrostatic capacitance between the diaphragm 2020 and the plate 2030. In the condenser microphone 2001, variations of sound pressure applied to the diaphragm 2020 are converted into variations of electrostatic capacitance, which are then converted into potential variations, based on which electric signals are produced in response to variations of sound pressure.

Next, a manufacturing method of the condenser microphone 2001 will be described with reference to FIGS. 15A to 15F and FIGS. 16A to 16F.

Figure 15A:
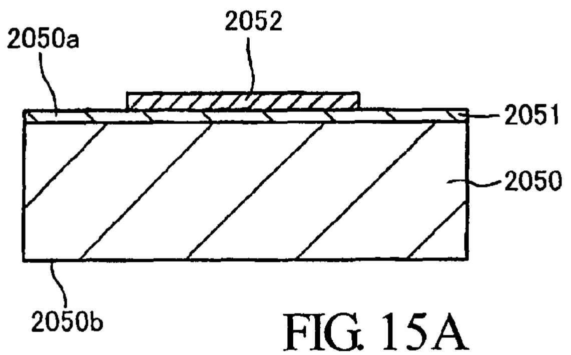
FIG. 15A is a cross-sectional view for explaining a first step of a manufacturing method of the condenser microphone.
Figure 15B:
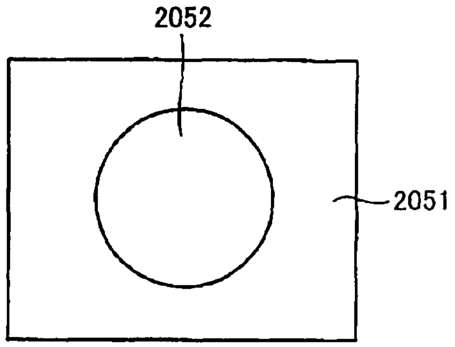
FIG. 15B is a plan view corresponding to FIG. 15A.

In a first step of the manufacturing method (i.e., (A1) and (B1) shown in FIGS. 15A and 15B), a first film 2051 serving as a sacrifice film is deposited on a wafer 2050 corresponding to the substrate 2010 (see FIGS. 14A and 14B). Specifically, silicon dioxide is deposited on the monocrystal silicon wafer 2050 by way of plasma CVD, thus forming the first film 2051.

Next, a second film 2052 is deposited on the first film 2051. Specifically, phosphorus-doped polysilicon is deposited on the first film 2051 by way of decompression CVD, thus forming the second film 2052. Next, a photoresist film is applied to the entire surface of the second film 2052; then, a resist pattern is formed by way of photolithography for performing exposure and development using a prescribed resist mask. Then, the second film 2052 is selectively removed by way of anisotropic etching such as RIE, thus shaping the second film 2052 having a circular shape.

Figure 15C:
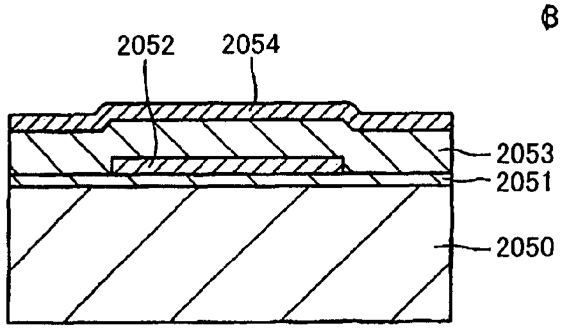
FIG. 15C is a cross-sectional view for explaining a second step of the manufacturing method of the condenser microphone.
Figure 15D:
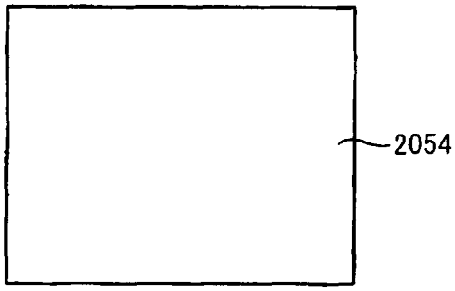
FIG. 15D is a plan view corresponding to FIG. 15C.

In a second step of the manufacturing method (i.e., (A2) and (B2) shown in FIGS. 15C and 15D), a third film 2053 is deposited on the second film 2052. That is, silicon dioxide is deposited on the second film 2052 by way of plasma CVD, thus forming the third film 2053.

Figure 15E:
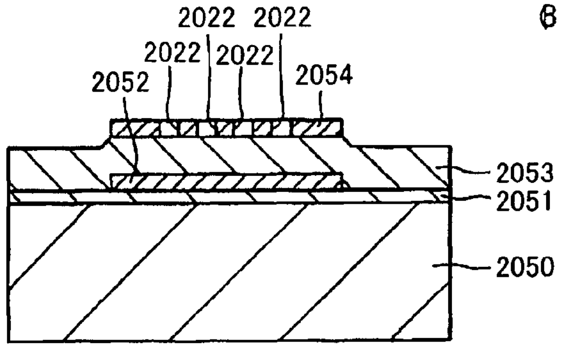
FIG. 15E is a cross-sectional view for explaining a third step of the manufacturing method of the condenser microphone.
Figure 15F:
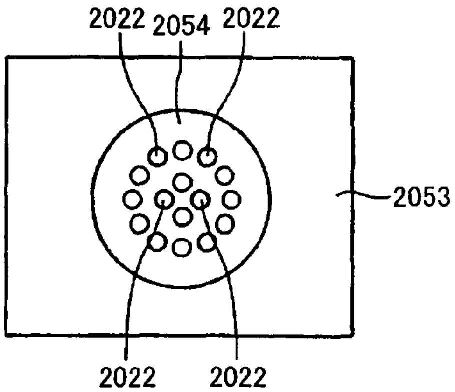
FIG. 15F is a plan view corresponding to FIG. 15E.

In a third step of the manufacturing method (i.e., (A3) and (B3) shown in FIGS. 15E and 15F), a fourth film 2054 is deposited on the third film 2053. Specifically, phosphorus-doped polysilicon is deposited on the third film 2053 by way of decompression CVD, thus forming the fourth film 2054. Next, a photoresist film is applied to the entire surface of the fourth film 2054; then, a resist pattern is formed by way of photolithography for performing exposure and development using a prescribed resist mask. Then, the fourth film 2054 is selectively removed by way of anisotropic etching such as RIE, thus shaping the fourth film 2054 having a circular shape and a plurality of holes 2022.

Figure 16A:
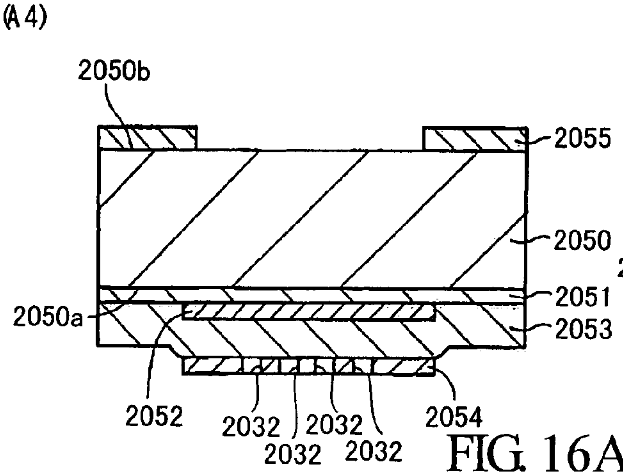
FIG. 16A is a cross-sectional view for explaining a fourth step of the manufacturing method of the condenser microphone.
Figure 16B:
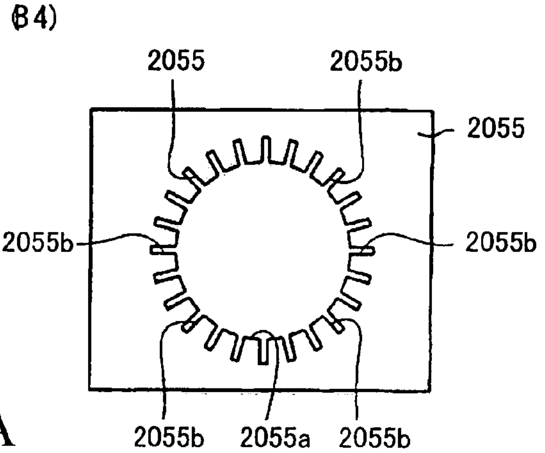
FIG. 16B is a plan view corresponding to FIG. 16A.

In a fourth step of the manufacturing method (i.e., (A4) and (B4) shown in FIGS. 16A and 16B), a mask 2055 having an opening 2055*a* and a plurality of openings 2055*b* is formed on a second surface 2050*b* opposite to the first surface 2050*a* of the wafer 2050 on which the first film 2051, the second film 2052, the third film 2053, and the fourth film 2054 are laminated together. That is, a photoresist mask is applied entirely to the second surface 2050*b* of the wafer 2050; then, the mask 2055 is formed by way of photolithography for performing exposure and development using a prescribed resist mask. The opening 2055*a* (serving as the first opening) has a circular shape in conformity with the two-dimensional shape of the diaphragm 2020 (see FIG. 14A). Each of the openings 2055*b* (serving as the second opening) has a rectangular shape elongated from the periphery of the opening 2055*a* in its radial direction. The openings 2055*b* are formed in a radial manner with respect to the opening 2055*a*. That is, the opening 2055*a* and the openings 2055*b* collectively form a gear-like shape. The shorthand width (or slit width) of the opening 2055*b* is much smaller than the diameter of the opening 2055*a*. For example, the diameter of the opening 2055*a* ranges from 100 μm to 1000 μm, preferably, it is approximately set to 600 μm; and the slit width of the opening 2055*b* ranges from 1 μm to 50 μm, preferably, it is approximately set to 40 μm.

Figure 16C:
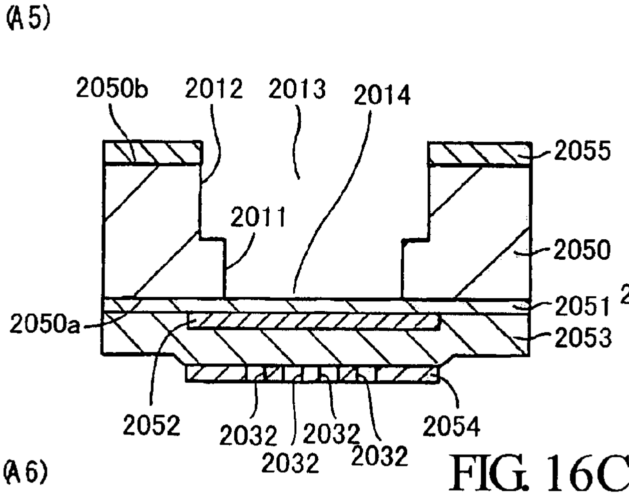
FIG. 16C is a cross-sectional view for explaining a fifth step of the manufacturing method of the condenser microphone.
Figure 16D:
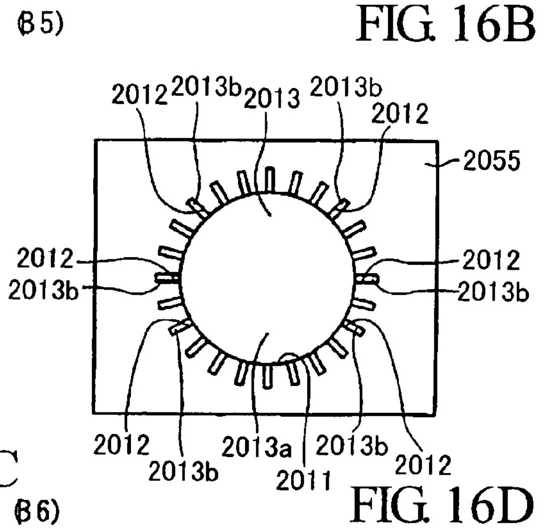
FIG. 16D is a plan view corresponding to FIG. 16C.

In a fifth step of the manufacturing method (i.e., (A5) and (B5) shown in FIGS. 16C and 16D), anisotropic etching is performed using the mask 2055 on the wafer 2050, thus forming the through-hole 2011 and the recesses 2012 in the wafer 2050. Specifically, the prescribed portion of the wafer 2050 exposed from the mask 2055 is selectively removed by way of Deep-RIE. The anisotropic etching is continuously performed until the through-hole 2011 substantially matches the opening 2055*a* of the mask 2055 of the wafer 2050. Since the slit width of the opening 2055*b* is much smaller than the diameter of the opening 2055*a*, the etching speed applied to the exposed portions of the openings 2055*b* of the wafer 2050 is slower than the etching speed applied to the exposed portion of the opening 2055*a* of the wafer 2050 due to the aspect-dependent etching effect. Thus, the recesses 2012 are reliably formed in conformity with the exposed portions of the openings 2055*b* of the wafer 2050.

Next, the mask 2055 is removed by use of a resist peeling solution such as NMP (N-methyl-2-pyrolidone).

Figure 16E:
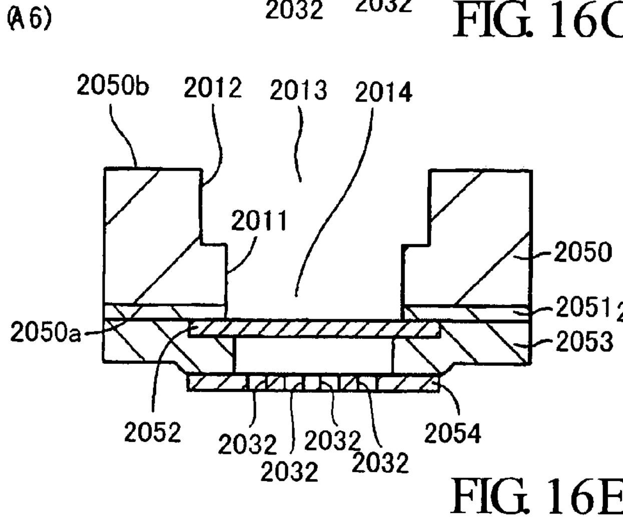
FIG. 16E is a cross-sectional view for explaining a sixth step of the manufacturing method of the condenser microphone.
Figure 16F:
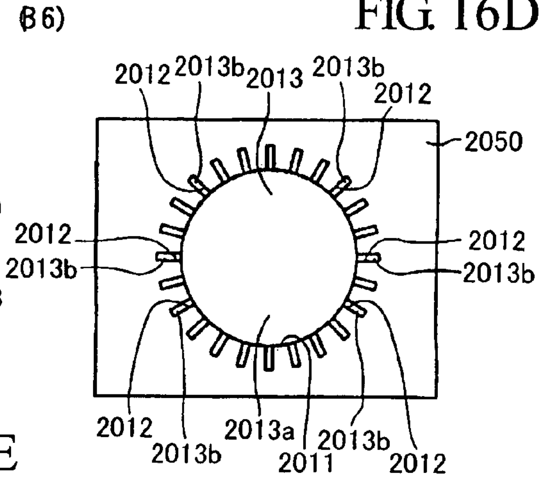
FIG. 16F is a plan view corresponding to FIG. 16E.

In a sixth step of the manufacturing method (i.e., (A6) and (B6) shown in FIGS. 16E and 16F), wet etching is performed using an etching solution such as buffered hydrofluoric acid (or Buffered HF) so as to selectively remove the first film 2051 and the third film 2053, both of which are silicon oxide films. The etching solution is introduced via the through-hole 2011 and the recesses 2012 of the wafer 2050 as well as the holes 2032 of the fourth film 2054, thus dissolving the first film 2051 and the third film 2053. By appropriately designing the shapes and arrangements of the through-hole 2011 and the holes 2032, it is possible to form the through-holes 2015 and 2016 in the first film 2051 and the third film 2053, whereby it is possible to form the sensing portion constituted of the diaphragm 2020, the plate 2030, and the support 2040 (see FIG. 14A). The diaphragm 2020 has a circular shape in correspondence with the through-hole 2011, which is shaped in conformity with the opening 2014 of the first surface 2050*a* of the wafer 2050. The aforementioned process will be referred to as a wet etching process.

Thereafter, dicing and packaging steps are performed, thus, it is possible to completely produce the condenser microphone 2001.

In the third embodiment, the opening 2013 of the first surface 2050*a* of the substrate 2010 has a gear-like shape constituted of the through-hole 2011 and the recesses 2012. Even when bubbles occur so as to entirely cover the opening 2013 (i.e., an inlet opening for introducing an etching solution) in the wet etching process, surface tensions are unevenly distributed to bubbles due to the rectangular openings 2013*b*, which are elongated from the periphery of the opening 2013*a* having a circular shape in a radial direction; hence, bubbles may be easily burst. This simplifies the manufacturing process of the condenser microphone 2001.

In the third embodiment, the openings 2013*b* are formed on the second surface 2010*b* of the substrate 2010 by means of the recesses 2012, which are not opened in the first surface 2010*a* of the substrate 2010. This makes it possible to form the opening 2014 on the first surface 2010*a* of the substrate 2010 in correspondence with the two-dimensional shape of the diaphragm 2020 irrespective of the shape of the opening 2013 of the second surface 2010*b* of the substrate 2010. For this reason, it is possible to prevent output characteristics of the condenser microphone 2001 from being degraded.

The third embodiment can be further modified in a variety of ways; hence, variations will be described below.

(a) First Variation

Figure 17A:
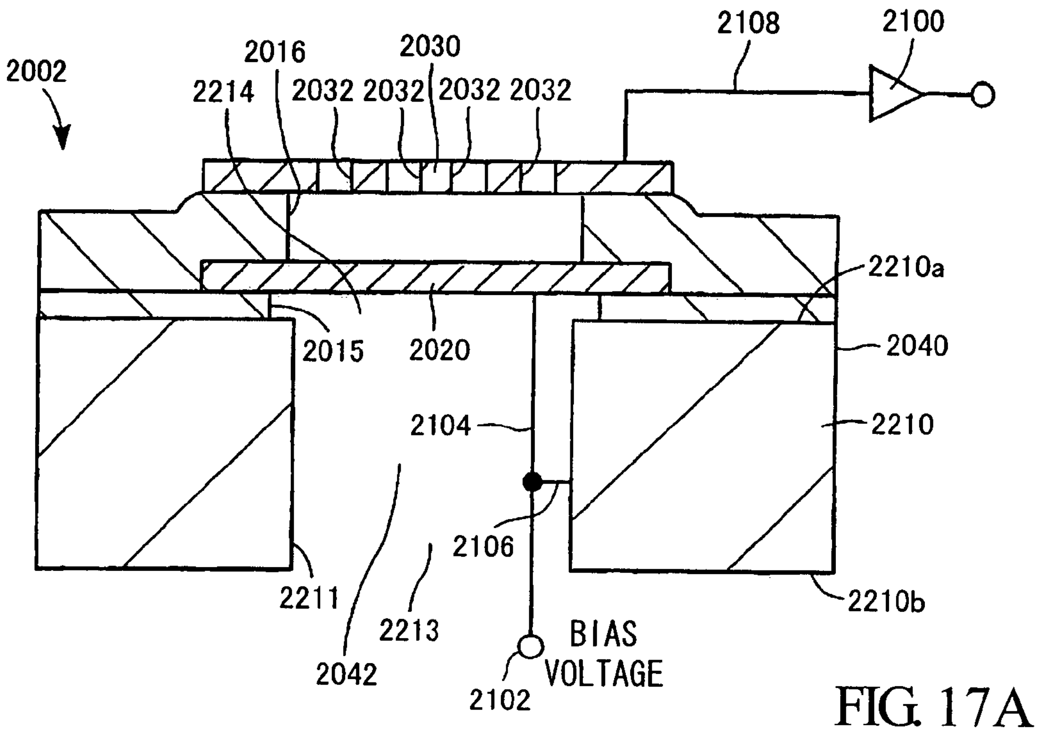
FIG. 17A is a cross-sectional view taken along line A4-A4 in FIG. 17B, which shows the constitution of a condenser microphone according to a first variation of the third embodiment.
Figure 17B:
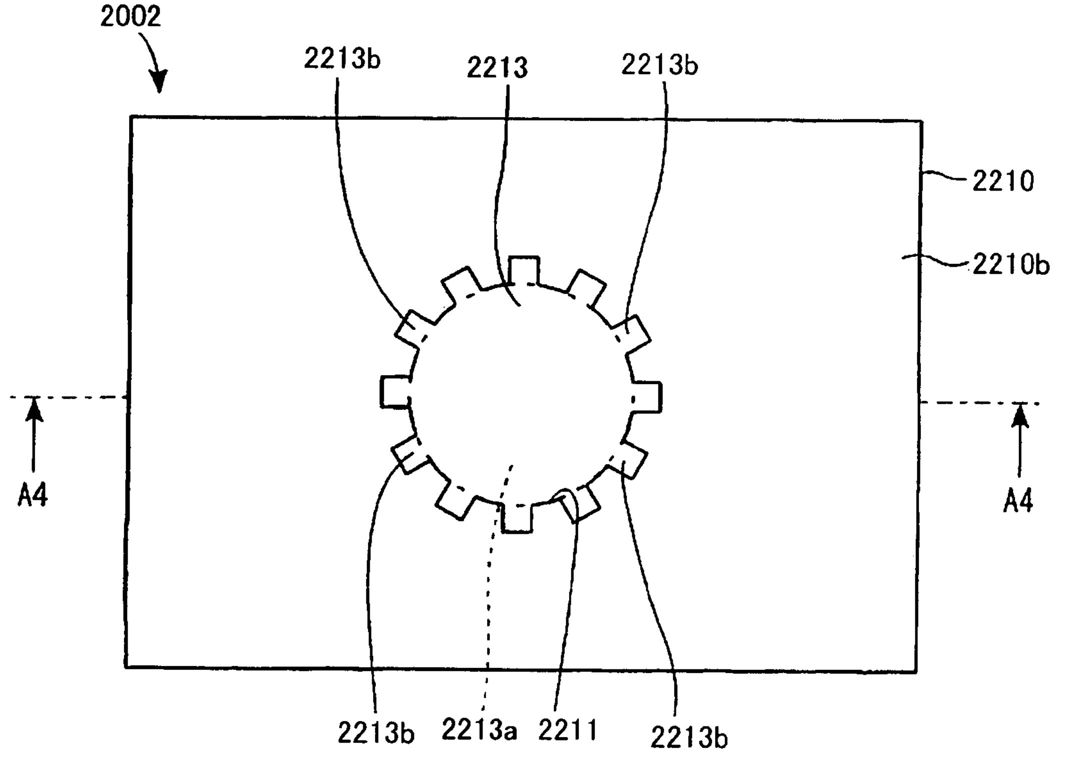
FIG. 17B is a bottom view corresponding to FIG. 17A.

FIGS. 17A and 17B show the constitution of a condenser microphone 2002 in accordance with a first variation of the third embodiment. The condenser microphone 2002 has a substrate 2210 having a first through-hole 2211. All the constituent elements of the condenser microphone 2002 are substantially identical to those of the condenser microphone 2001 except for the substrate 2210 forming the sensing portion.

As shown in FIGS. 17A and 17B, the substrate 2210 is a monocrystal silicon substrate, in which the first through-hole 2211 and second through-holes 2212 are formed in a thickness direction. An opening 2213 having a gear-like shape constituted of an opening 2213*a* (corresponding to the first through-hole 2211) and a plurality of openings 2213*b* (corresponding to the second through-holes 2212) is formed in a second surface 2210*b* of the substrate 2210. The opening 2213*a* (serving as a second opening) has a circular shape. Each of the openings 2213*b* (serving as fourth openings) has a rectangular shape elongated from the periphery of the opening 2213*a* in its radial direction. On the other hand, a first opening (corresponding to the first through-hole 2211) and a plurality of third openings (corresponding to the second through-holes 2212) are formed in a first surface 2210*a* of the substrate 2210. Herein, the first opening is shaped substantially in conformity with the opening 2213*a*, and the third openings are shaped substantially in conformity with the openings 2213*b*.

Next, a manufacturing method of the condenser microphone 2002 will be described with reference to FIGS. 18A to 18D. Similar to the manufacturing method of the condenser microphone 2001, the first film 2051, the second film 2052, the third film 2053, and the fourth film 2054 are deposited on the first surface 2050*a* of the wafer 2050 forming the substrate 2210.

Figure 18A:
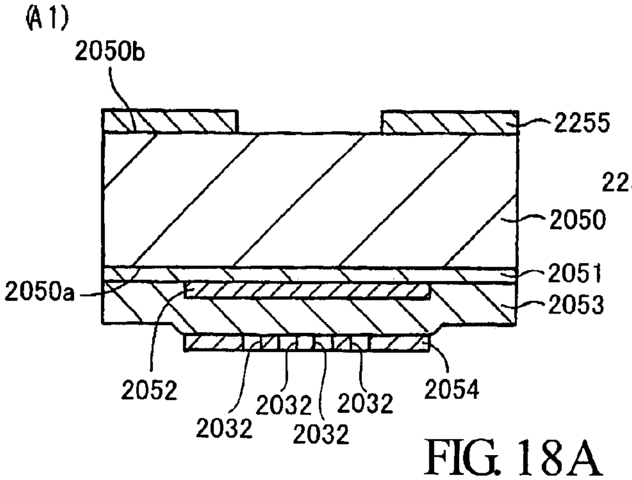
FIG. 18A is a cross-sectional view for explaining a first step of a manufacturing method of the condenser microphone.
Figure 18B:
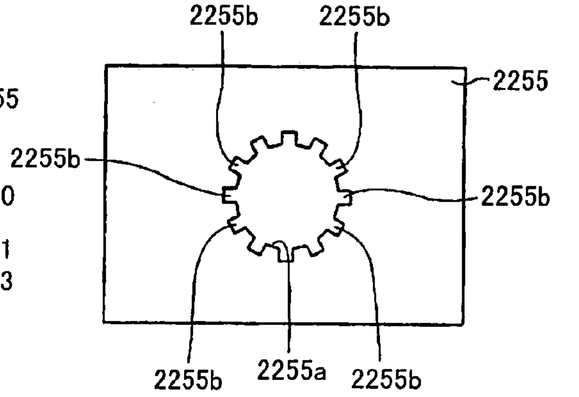
FIG. 18B is a plan view corresponding to FIG. 18A.

In a first step of the manufacturing method (i.e., (A1) and (B1) shown in FIGS. 18A and 18B), a mask 2255 having an opening 2255*a* (serving as the first opening) and a plurality of openings 2255*b* (serving as the second openings) is formed on the second surface 2050*b* opposite to the first surface 2050*a* of the wafer 2050. The mask 2255 is substantially identical to the mask 2055 so that the openings 2255*a* and 2255*b* substantially match the openings 2055*a* and 2055*b*, although the widths of the openings 2255*b* can be adequately increased so that the etching speed applied to the exposed portion of the opening 2255*a* becomes substantially identical to the etching speed applied to the exposed portions of the openings 2255*b*. For example, the diameter of the opening 2255*a* ranges from 100 μm to 1000 μm, preferably, it is approximately set to 600 μm; and the width of the opening 2255*b* ranges from 40 μm to 200 μm, preferably, it is approximately set to 100 μm.

Figure 18C:
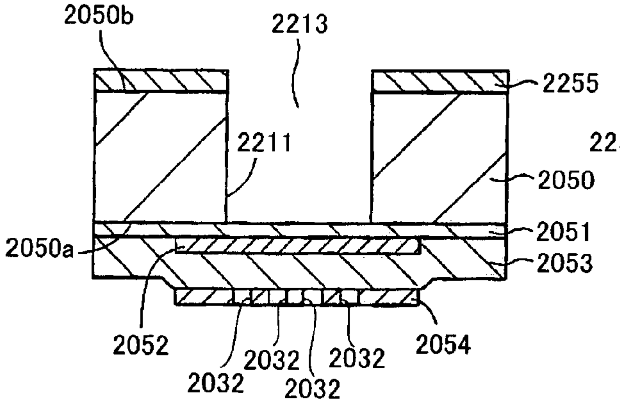
FIG. 18C is a cross-sectional view for explaining a second step of the manufacturing method of the condenser microphone.
Figure 18D:
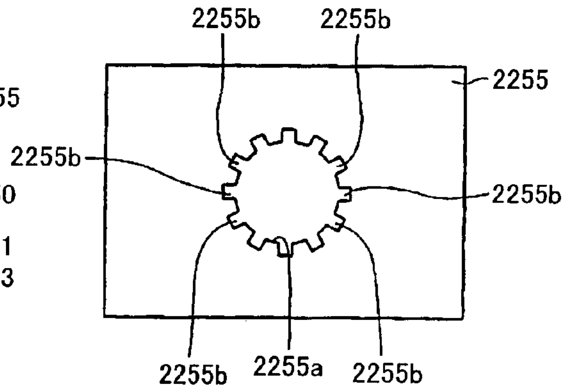
FIG. 18D is a plan view corresponding to FIG. 18C.

In a second step of the manufacturing method (i.e., (A2) and (B2) shown in FIGS. 18C and 18D), anisotropic etching is performed using the mask 2255 on the wafer 2050 so as to form the first through-hole 2211 and the second through-holes 2212 in the wafer 2050. Specifically, the prescribed portion of the wafer 2050 exposed from the mask 2255 is selectively removed by way of Deep-RIE. Since substantially the same etching speed is applied to both of the exposed portion of the opening 2255*a* and the exposed portions of the openings 2255*b*, the first through-hole 2211 is formed in conformity with the opening 2255*a*, and the second through-holes 2212 are formed in conformity with the openings 2255*b* in the wafer 2050.

Steps following the aforementioned steps are substantially identical to those of the manufacturing method of the condenser microphone 2001.

In the third embodiment, the opening 2213 formed on the second surface 2210*b* of the substrate 2210 has a gear-like shape constituted of the first through-hole 2211 and the second through-holes 2212. As a result, even when bubbles occur to entirely cover the opening 2213, which is an inlet opening for introducing an etching solution, in the wet etching process, surface tensions are unevenly distributed to bubbles by means of the rectangular openings 2213*b* elongated from the periphery of the circular opening 2213*a* in its radial direction; hence, bubbles may be easily burst. This simplifies the manufacturing process of the condenser microphone 2002.

In the first variation of the third embodiment, a circular opening is formed in conformity with the two-dimensional shape of the diaphragm 2020 on the first surface 2210*a* of the substrate 2210 by means of the first through-hole 2211. By appropriately designing the second through-holes 2212, it is possible to prevent output characteristics of the condenser microphone 2002 from being degraded.

(b) Other Variations

The third embodiment and its first variation are each directed to the condenser microphone as an example of the pressure sensor. Of course, the third embodiment can be applied to other types of pressure sensors that detect pressure variations other than variations of sound pressure.

Figure 19A:
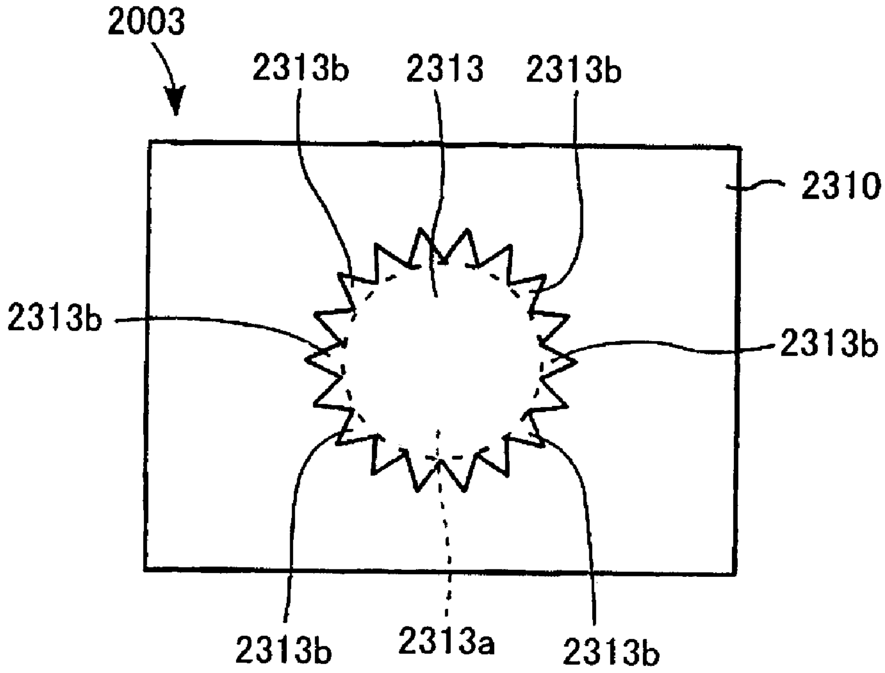
FIG. 19A is a bottom view showing the constitution of a condenser microphone according to a second variation of the third embodiment.
Figure 19B:
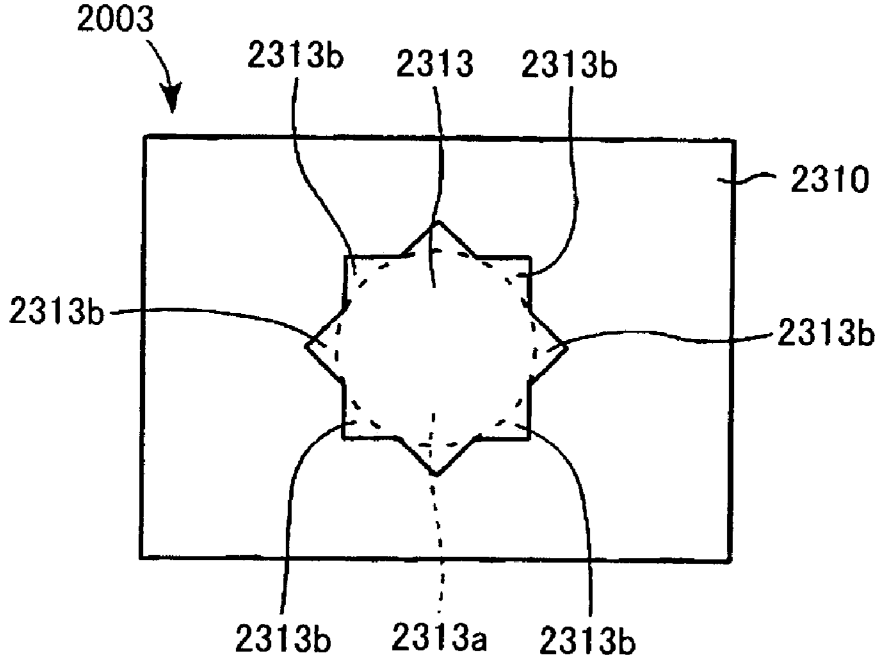
FIG. 19B is a bottom view showing the constitution of a condenser microphone according to a third variation of the third embodiment.

In the third embodiment and its first variation, a gear-like opening is formed on the second surface of the substrate positioned opposite to the diaphragm, whereas the opening formed on the second surface of the substrate is not necessarily formed in a gear-like shape. For example, it is possible to produce a condenser microphone 2003 as shown in FIGS. 19A and 19B, in which an opening 2313 constituted of an opening 2313*a* (that is shaped in conformity with the two-dimensional shape of the diaphragm) and a plurality of openings 2313*b* (having triangular shapes that project externally of the periphery of the opening 2313*a*) is formed in the second surface o a substrate 2310.

Incidentally, the third embodiment and its variations are all directed to the condenser microphone having the circular diaphragm 2020, although the two-dimensional shape of the diaphragm 2020 is not necessarily limited to the circular shape. For example, the opening 2013*a* can be formed in a prescribed shape other than the circular shape in conformity with the two-dimensional shape of the diaphragm 2020 in the condenser microphone 2001. Similarly, the opening 2213*a* can be formed in a prescribed shape other than the circular shape in conformity with the two-dimensional shape of the diaphragm 2020.

Lastly, the present invention is not necessarily limited to the aforementioned embodiments and variations; hence, it can be further modified within the scope of the invention defined by the appended claims.

What is claimed is:

1. A manufacturing method of a pressure sensor including a plate having a fixed electrode, a diaphragm that has a moving electrode positioned opposite to the fixed electrode and that is subjected to displacement due to pressure variations applied thereto, and a support having at least one cavity for supporting the plate, said manufacturing method comprising:

depositing a thin film forming the plate and a thin film forming the diaphragm on a first surface of a substrate;

forming a first mask having a first opening on a second surface opposite to the first surface of the substrate;

forming a second mask having a second opening on the second surface of the substrate, wherein the second mask covers the first mask so that a prescribed portion of the substrate just above the thin film forming the plate is exposed in the second opening;

forming a recess by performing anisotropic etching on the substrate exposed in the second opening by use of the second mask;

removing the second mask while allowing the first mask to remain; and performing anisotropic etching using the remaining first mask on the substrate exposed in the first opening such that a bottom of the recess is removed, thus forming a through-hole forming the cavity in the substrate.

2. A manufacturing method of a pressure sensor including a plate having a fixed electrode, a diaphragm that has a moving electrode positioned opposite to the fixed electrode and that is subjected to displacement due to pressure variations applied thereto, and a support having at least one cavity for supporting the pate, said manufacturing method comprising:

depositing a thin film forming the plate and a thin film forming the diaphragm on a first side of a substrate;

forming one mask having a first opening on a second side opposite to the first side of the substrate;

forming a recess by performing a first anisotropic etching on the substrate exposed in the first opening by using the one mask;

forming another mask having a second opening on the second side of the substrate, wherein an area of the second opening differs from an area of the first opening; and performing a second anisotropic etching on the substrate exposed in the second opening by using the other mask such that a bottom of the recess is removed so as to form a through-hole forming the cavity.

3. The manufacturing method of the pressure sensor according to claim 2, wherein the area of the second opening is larger than the area of the first opening and the one mask is constituted of a plurality of layers, the other mask being formed by removing at least one of the layers constituting the one mask.

4. A manufacturing method of a pressure sensor including a plate having a fixed electrode, a diaphragm that has a moving electrode positioned opposite to the fixed electrode and that is subjected to displacement due to pressure variations applied thereto, and a support having at least one cavity for supporting the plate, said manufacturing method comprising:

depositing a thin film forming the plate and a thin film forming the diaphragm on a first side of a substrate;

forming a first mask having a first opening on a second side opposite to the first side of the substrate;

forming a second mask having a second opening on the second side of the substrate, wherein an area of the second opening is smaller than an area of the first opening;

forming a recess by performing a first anisotropic etching on the substrate exposed in the second opening by using the second mask;

removing the second mask; and performing a second anisotropic etching on the substrate exposed in the first opening by using the first mask such that a bottom of the recess is removed so as to form a through-hole forming the cavity.

5. The manufacturing method of the pressure sensor according to claim 4, wherein the second mask is formed to cover the first mask.

* * * * *